(12) United States Patent
Kim et al.

(10) Patent No.: US 8,883,651 B2
(45) Date of Patent: *Nov. 11, 2014

(54) SEMICONDUCTOR DEVICES AND METHODS OF MANUFACTURING THE SAME

(75) Inventors: Seokhoon Kim, Hwaseong-si (KR); Sangsu Kim, Yongin-si (KR); Chung Geun Koh, Seoul (KR); Byeongchan Lee, Yongin-si (KR); Sunghil Lee, Hwaseong-si (KR); Jinyeong Joe, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/562,826

(22) Filed: Jul. 31, 2012

(65) Prior Publication Data

US 2013/0045589 A1  Feb. 21, 2013

(30) Foreign Application Priority Data

Aug. 19, 2011 (KR) .................. 10-2011-0082715

(51) Int. Cl.
| | | |
|---|---|---|
| *H01L 21/302* | (2006.01) | |
| *H01L 21/461* | (2006.01) | |
| *H01L 29/10* | (2006.01) | |
| *H01L 29/08* | (2006.01) | |
| *H01L 21/306* | (2006.01) | |
| *H01L 29/66* | (2006.01) | |
| *H01L 21/265* | (2006.01) | |
| *H01L 29/78* | (2006.01) | |
| *H01L 21/762* | (2006.01) | |
| *H01L 29/165* | (2006.01) | |
| *H01L 21/324* | (2006.01) | |

(52) U.S. Cl.
CPC .......... *H01L 29/165* (2013.01); *H01L 29/1037* (2013.01); *H01L 29/0847* (2013.01); *H01L 21/30608* (2013.01); *H01L 29/66545* (2013.01); *H01L 21/26586* (2013.01); *H01L 29/7834* (2013.01); *H01L 29/7835* (2013.01); *H01L 21/26593* (2013.01); *H01L 21/76237* (2013.01); *H01L 21/30604* (2013.01); *H01L 21/324* (2013.01); *H01L 29/7848* (2013.01); *H01L 21/26506* (2013.01); *H01L 29/66636* (2013.01); *H01L 29/6659* (2013.01); *H01L 29/6653* (2013.01); *H01L 29/66621* (2013.01)
USPC .............. 438/739; 257/E21.09; 257/E21.409; 257/E21.431; 257/E21.619; 257/E21.634; 438/198; 438/299; 438/300; 438/303; 438/478; 438/735

(58) Field of Classification Search
USPC ..................... 257/E21.09, E21.409, E21.431, 257/E21.619, E21.634
See application file for complete search history.

(56) References Cited

U.S. PATENT DOCUMENTS 6,030,898 A * 2/2000 Liu ............................... 438/692
7,045,407 B2    5/2006 Keating et al.

(Continued)

FOREIGN PATENT DOCUMENTS

| JP | 2003-109969 | 4/2003 |
| KR | 1020050121479 | 12/2005 |
| KR | 1020060105042 | 10/2006 |

*Primary Examiner* — Asok K Sarkar
(74) *Attorney, Agent, or Firm* — F. Chau & Associates, LLC

(57) ABSTRACT

A method of manufacturing a transistor of a semiconductor device, the method including forming a gate pattern on a semiconductor substrate, forming a spacer on a sidewall of the gate pattern, wet etching the semiconductor substrate to form a first recess in the semiconductor substrate, wherein the first recess is adjacent to the spacer, and wet etching the first recess to form a second recess in the semiconductor substrate.

20 Claims, 28 Drawing Sheets

(56) References Cited

U.S. PATENT DOCUMENTS

| | | |
|---|---|---|
| 7,354,835 B2 | 4/2008 | Shin et al. |
| 8,269,255 B2 * | 9/2012 | Shin et al. ............... 257/190 |
| 8,455,317 B2 * | 6/2013 | Shin et al. ............... 438/269 |
| 2008/0038887 A1 * | 2/2008 | Chang et al. ............. 438/230 |
| 2008/0237634 A1 * | 10/2008 | Dyer et al. ............... 257/190 |
| 2012/0132957 A1 * | 5/2012 | Sung et al. ............... 257/192 |

* cited by examiner

SEMICONDUCTOR DEVICES AND METHODS OF MANUFACTURING THE SAME

CROSS-REFERENCE TO RELATED APPLICATION

This U.S. non-provisional patent application claims priority under 35 U.S.C. §119 to Korean Patent Application No. 10-2011-0082715, filed on Aug. 19, 2011, the disclosure of which is incorporated by reference herein in its entirety.

BACKGROUND

1. Technical Field

The present inventive concept relates to semiconductor devices and methods of manufacturing the same.

2. Discussion of the Related Art

Semiconductor devices are used in almost every industrial field, including various electronic devices, vehicles, vessels and so forth. A field effect transistor (hereinafter referred to as a transistor) is a fundamental building block of modern semiconductor devices. Some transistors are packaged individually, but many more are found embedded in integrated circuits.

The transistor may include a source and a drain spaced apart from each other in a semiconductor substrate, and a gate electrode covering the top surface of a channel region between the source and the drain. The source and the drain may be formed by implanting dopant ions into the semiconductor substrate. The gate electrode may be insulated from the channel region by a gate oxide layer disposed between the semiconductor substrate and the gate electrode.

Developments have been made to achieve highly-integrated, high speed semiconductor devices. Thus, the size of a transistor becomes reduced, so that the turn-on current of the transistor may be decreased. However, the decrease in the turn-on current of the transistor may cause a decrease in the operation speed of the transistor. Thus, the reliability and the operation speed of the semiconductor device may be reduced. Accordingly, there is a need to increase the turn-on current of a transistor in a highly-integrated semiconductor device.

SUMMARY

Exemplary embodiments of the inventive concept provide semiconductor devices with improved reliability and methods of manufacturing the same.

Exemplary embodiments of the inventive concept provide semiconductor devices with high integration and methods of manufacturing the same.

Exemplary embodiments of the inventive concept provide semiconductor devices which can increase a turn-on current of a transistor, and methods of manufacturing the same.

According to an exemplary embodiment of the inventive concept, a method of manufacturing a transistor of a semiconductor device includes: forming a gate pattern on a semiconductor substrate; forming a spacer on a sidewall of the gate pattern; wet etching the semiconductor substrate to form a first recess in the semiconductor substrate, wherein the first recess is adjacent to the spacer; and wet etching the first recess to form a second recess in the semiconductor substrate.

The first recess has curved sidewalls and the second recess has tapered sidewalls.

At least one tapered sidewall has a {111} crystal plane.

A portion of the spacer adjacent to a surface of the semiconductor substrate protrudes away from the sidewall of the gate pattern.

The spacer with the protruding portion has a cantilever shape.

The method further includes performing an epitaxial growth process to form an epitaxial pattern that fills the second recess.

A surface of the epitaxial pattern is disposed over the surface of the semiconductor substrate.

A doped portion of the epitaxial pattern is a source or a drain of a transistor.

A channel region of the transistor is formed between adjacent epitaxial patterns.

The gate pattern includes a gate electrode of a transistor.

According to an exemplary embodiment of the inventive concept, a method of manufacturing a semiconductor device includes: implanting amorphization element ions into a semiconductor substrate to form an amorphous region in the semiconductor substrate; annealing the amorphous region to form a phase change region in the semiconductor substrate; wet etching the phase change region to form a first recess in the semiconductor substrate; and wet etching the first recess to form a second recess in the semiconductor substrate.

The first recess has curved sidewalls and the second recess has tapered sidewalls.

The annealing temperature is less than 500 degrees Celsius.

The annealing temperature is about 350 degrees Celsius to about 450 degrees Celsius.

According to an exemplary embodiment of the inventive concept, a method of manufacturing a semiconductor device includes: wet etching a semiconductor substrate to form a first recess in the semiconductor substrate, wherein the first recess has curved sidewalls; and wet etching the first recess to form a second recess in the semiconductor substrate, wherein the second recess has tapered sidewalls.

The first recess has a concave shape.

The tapered sidewalls of the second recess are connected by a substantially straight line.

Before wet etching the semiconductor substrate to form the first recess, the method includes: implanting amorphization element ions into the semiconductor substrate to form an amorphous region in the semiconductor substrate; and annealing the amorphous region to form a phase change region in the semiconductor substrate, wherein the first recess is formed by wet etching the phase change region.

The annealing is performed at a temperature below 500 degrees Celsius.

The temperature is about 350 degrees Celsius to about 450 degrees Celsius.

The amorphization element ions are implanted into the semiconductor substrate by a vertical or tilt implantation method.

An etchant used to wet etch the semiconductor substrate to form the first recess includes at least one of hydrofluoric acid (HF), nitric acid (HNO3) and acetic acid (CH3COOH).

After wet etching the first recess to form the second recess, the method includes performing an epitaxial growth process to form an epitaxial pattern that fills the second recess.

The epitaxial pattern has a hexagon shape.

The epitaxial pattern has a different semiconductor element than the semiconductor substrate.

According to an exemplary embodiment of the inventive concept, a method of manufacturing a semiconductor device includes: implanting amorphization element ions into a semiconductor substrate to form an amorphous region in the semiconductor substrate; annealing the amorphous region to form a phase change region in the semiconductor substrate; dry etching the phase change region to form a first recess in the semiconductor substrate; and wet etching the first recess to form a second recess in the semiconductor substrate.

The first recess has curved sidewalls and the second recess has tapered sidewalls.

BRIEF DESCRIPTION OF THE DRAWINGS

The above and other features of the inventive concept will become more apparent by describing in detail exemplary embodiments thereof with reference to the attached drawings in which.

DETAILED DESCRIPTION OF THE EMBODIMENTS

Figure 1A:
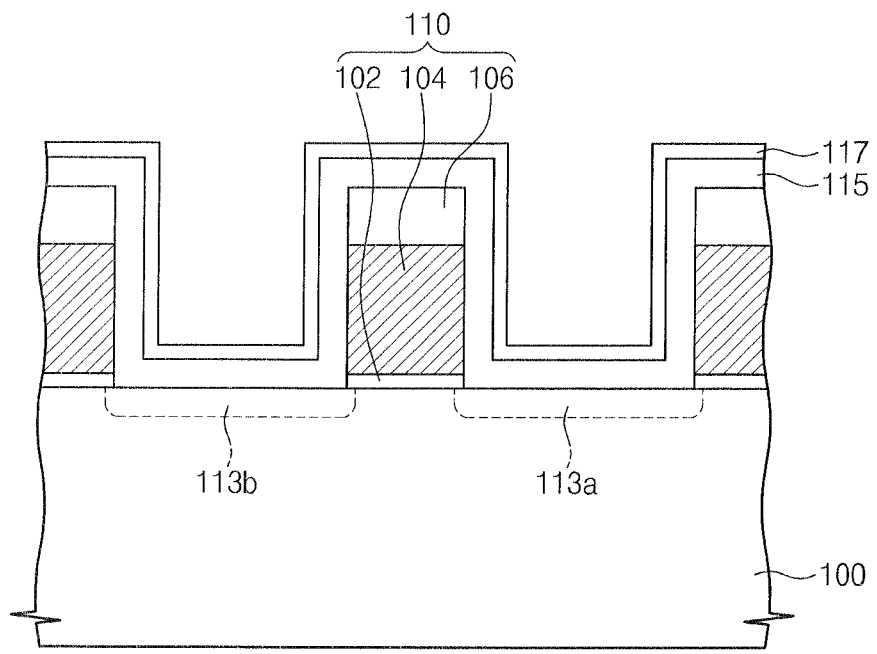
FIGS. 1A through 1G are cross-sectional views illustrating a method of manufacturing a semiconductor device according to an exemplary embodiment of the inventive concept.

Hereinafter, exemplary embodiments of the inventive concept will be described in detail with reference to the accompanying drawings. The inventive concept may, however, be embodied in many different forms and should not be construed as limited to the exemplary embodiments set forth herein. Certain aspects of the drawings may be exaggerated for clarity.

It will be understood that when an element such as a layer, region or substrate is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present.

Like reference numerals may denote like elements throughout the specification and drawings, unless otherwise noted.

FIGS. 1A through 1G are cross-sectional views illustrating a method of manufacturing a semiconductor device according to an exemplary embodiment of the inventive concept. FIG. 2 is a flowchart illustrating a method of forming a concave region according to an exemplary embodiment of the inventive concept.

Figure 2:
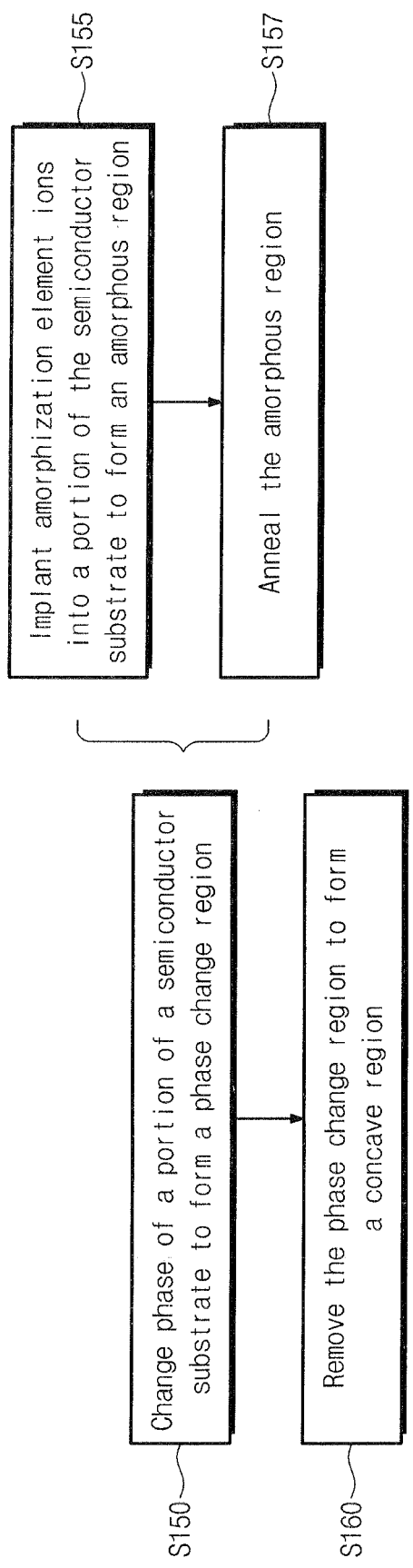
FIG. 2 is a flowchart illustrating a method of forming a concave region according to an exemplary embodiment of the inventive concept.

Referring to FIG. 1A, a gate pattern 110 may be formed on a semiconductor substrate 100. A device isolation pattern (not shown) may be formed on the semiconductor substrate 100 to define an active portion. The active portion may correspond to a portion of the semiconductor substrate 100 surrounded by the device isolation pattern. The gate pattern 110 may cross over the active portion. In some embodiments, the gate pattern 110 may include a gate dielectric pattern 102, a gate electrode 104, and a hard mask pattern 106 which are sequentially stacked.

The semiconductor substrate 100 may be formed of a semiconductor element. For example, the semiconductor substrate 100 may be a silicon substrate. The semiconductor substrate 100 may be in a single-crystalline state. The semiconductor substrate 100 may be doped with dopants of a first conductivity type. The gate dielectric pattern 102 may include an oxide (e.g., silicon oxide), a nitride (e.g., silicon nitride), an oxynitride (e.g., silicon oxynitride), and/or a high-k dielectric (e.g., an insulating metal oxide). The gate electrode 104 may include at least one of a semiconductor doped with dopants (e.g., doped silicon), a metal-semiconductor compound (e.g., metal silicide), a conductive metal nitride (e.g., titanium nitride, and/or tantalum nitride) and a transition metal (e.g., titanium, and/or tantalum). The hard mask pattern 106 may include a nitride (e.g., silicon nitride) and/or an oxynitride (e.g., silicon oxynitride).

A dopant implantation process may be performed using the gate pattern 110 as a mask to form first and second source/drain extensions 113a and 113b. The first and second source/drain extensions 113a and 113b may be formed in the semiconductor substrate 100 at both sides of the gate pattern 110, respectively. In other words, the gate pattern 110 may be disposed on the semiconductor substrate 100 between the first and second source/drain extensions 113a and 113b. The first and second source/drain extensions 113a and 113b may be doped with dopants of a second conductivity type. For example, one of the dopants of the first conductivity type may be P-type dopants, and one of the dopants of the second conductivity type may be N-type dopants, and vice versa.

Subsequently, a spacer layer 115 may be conformally formed on the semiconductor substrate 100. The spacer layer 115 may include an insulating material. In some embodiments, an additional spacer layer 117 may be conformally formed on the spacer layer 115. The additional spacer layer 117 may include an insulating material different from the spacer layer 115. For example, the spacer layer 115 may be formed of nitride (e.g., silicon nitride), and the additional spacer layer 117 may be formed of oxide (e.g., silicon oxide). In this case, before the spacer layer 115 is formed, a buffer oxide layer (not shown) may be formed on the semiconductor substrate 100. The buffer oxide layer may be formed by a thermal oxidation process, a chemical vapor deposition (CVD) process, and/or an atomic layer deposition (ALD) process. However, the inventive concept is not limited thereto. The spacer layer 115 may be formed of other insulating materials, except nitride. The additional spacer layer 117 may be thinner than the spacer layer 115.

Figure 1B:
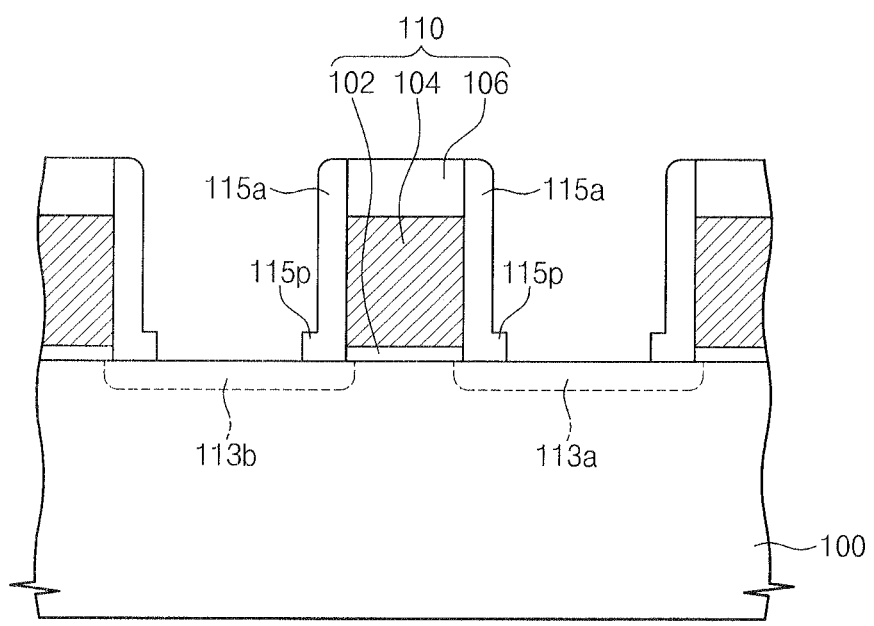

Referring to FIG. 1B, the additional spacer layer 117 and the spacer layer 115 may be successively etched by performing an etch-back process. Thus, a gate spacer 115a may be formed on both sidewalls of the gate pattern 110. In some embodiments, each of the gate spacers 115a may include a protruding portion 115p which laterally extends from a lower portion thereof. For example, each of the gate spacers 115a may have an 'L' shape. The additional spacer layer 117 on the protruding portion 115p may serve as an etch mask during the etch-back process, so that the protruding portion 115p may be formed.

After the gate spacers 115a are formed, the additional spacer layer 117 may be removed. The additional spacer layer 117 may be removed by the etch-back process. Alternatively, after the etch-back process is performed, a portion of the additional spacer layer 117 may remain. The remaining portion of the additional spacer layer 117 may be removed by a subsequent cleaning process.

Subsequently, concave regions 130a and 130b illustrated in FIG. 1E may be formed in the semiconductor substrate 100 at both sides of the gate pattern 110, respectively. The method of forming the concave regions 130a and 130b will be described with reference to the flowchart of FIG. 2 and FIGS. 1C through 1E in more detail.

As illustrated in FIG. 2, a phase of a portion of the semiconductor substrate 100 may be changed to form a phase change region (S150). The semiconductor substrate 100 may be in the single-crystalline state and the phase change region may have a phase different from the single-crystalline state. In some embodiments, the formation of the phase change region (S150) may include implanting amorphization element ions into a portion of the semiconductor substrate to form an amorphous region (S155), and annealing the amorphous region (S157). Hereinafter, these processes will be described in more detail.

Figure 1C:
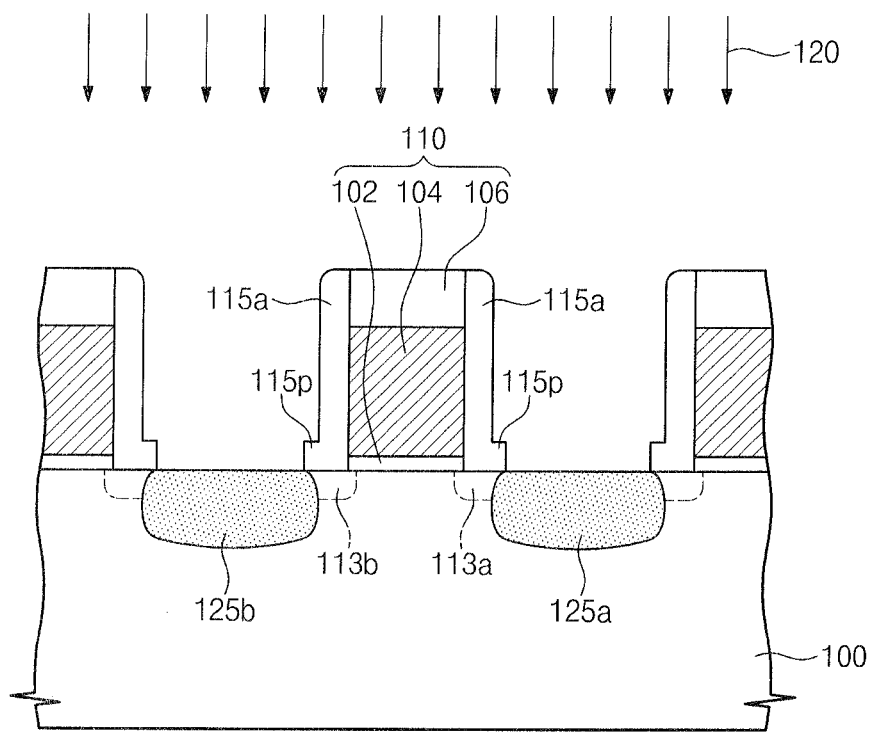

Referring to FIGS. 1C and 2, the amorphization element ions 120 may be implanted into the semiconductor substrate 100 using the gate pattern 110 and the gate spacers 115a as masks (S155). Portions of the semiconductor substrate 100 having single-crystalline states may be amorphized by the amorphization element ions 120. Thus, a first amorphous region 125a and a second amorphous region 125b may be formed in the semiconductor substrate 100 at both sides of the gate pattern 110, respectively.

An amorphization element of the amorphization element ions 120 may be an element capable of amorphizing portions of the semiconductor substrate 100. Additionally, the amorphization element may be electrically neutral with the semiconductor substrate 100. For example, the amorphization element may include at least one of germanium (Ge), silicon (Si), inert gas elements (e.g., argon (Ar), krypton (Kr), xenon (Xe), etc.), carbon (C), nitrogen (N), and oxygen (O). An implantation energy of the amorphization element ions 120 may be within a range of about 5 KeV to about 40 KeV. A dose of the amorphization element ions 120 may be within a range of about $1 \times 10^{14}$ atoms/cm$^2$ to about $1 \times 10^{16}$ atoms/cm$^2$. However, the inventive concept is not limited to the above ranges.

In some embodiments, the amorphization element ions 120 may be implanted into the semiconductor substrate 100 by a vertical implantation method. An implantation direction of the vertical implantation method may be substantially vertical with respect to a top surface of the semiconductor substrate 100. In other words, the implantation direction of the vertical implantation method may be vertical with respect to the top surface of the semiconductor substrate 100 or may be fractionally tilted with respect to the top surface of the semiconductor substrate 100 to minimize ion channeling. For example, the implantation direction of the vertical implantation method may have an angle within a range of 0 degrees to about 7 degrees with respect to a perpendicular line extending from the top surface of the semiconductor substrate 100.

The amorphization element ions 120 may be implanted at room temperature. In this case, the amorphization element may include at least one of germanium (Ge), silicon (Si), and xenon (Xe).

Alternatively, the amorphization element ions 120 may be implanted at a lower process temperature within a range of about −20 degrees Celsius to about −100 degrees Celsius. In this case, even though the amorphization element ions 120 are implanted by the vertical implantation method, lateral components of the amorphization element ions 120 may increase in the semiconductor substrate 100. As a result, a width of each of the amorphous regions 125a and 125b may increase. When the amorphization element ions 120 are implanted at the lower process temperature, the amorphization element may include at least one of germanium (Ge), silicon (Si), inert gas elements (e.g. argon (Ar), krypton (Kr), xenon (Xe), etc.), carbon (C), nitrogen (N), and oxygen (O).

Figure 1D:
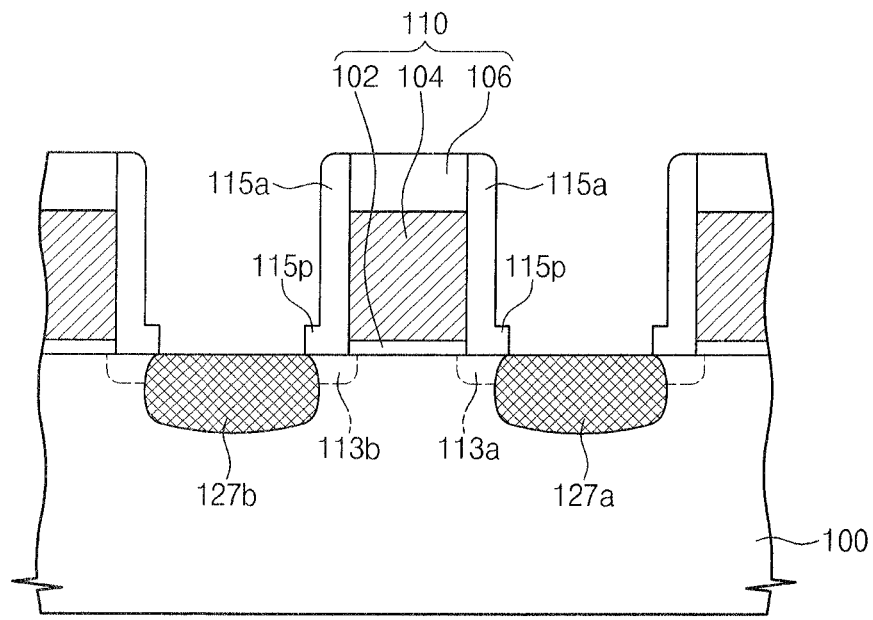

Referring to FIGS. 1D and 2, the first and second amorphous regions 125a and 125b may be annealed by an annealing process performed on the semiconductor substrate 100 (S157). Thus, first and second phase change regions 127a and 127b may be formed. Due to the annealing process, phases of the first and second amorphous regions 125a and 125b may be changed to form the first and second phase change regions 127a and 127b. At least a portion of the first amorphous region 125a may be changed to the first phase change region 127a and at least a portion of the second amorphous region 125b may be changed to the second phase change region 127b by the annealing process. In some embodiments, each of the first and second phase change regions 127a and 127b may be in a micro-crystalline state. The micro-crystalline state may have a phase between an amorphous state and a poly-crystalline state. For example, the micro-crystalline state may include a plurality of crystalline nuclei.

The annealing process may be performed at a process temperature within a range of about 300 degrees Celsius to about 650 degrees Celsius. The annealing process may be performed for a process time within a range of about 0.1 second to about 5 minutes. In some embodiments, the annealing process may be performed at a process temperature of less than 500 degrees Celsius. For example, within a range of about 350 degrees Celsius to about 450 degrees Celsius. In this case, the first and second amorphous regions 125a and 125b may be fully changed to form the first and second phase change regions 127a and 127b. Alternatively, the annealing process may be performed at a process temperature within a range of about 450 degrees Celsius to about 650 degrees Celsius. In this case, the first and second amorphous regions 125a and 125b may be partially changed to form first and second phase change regions. This case will be described later.

The annealing process may be performed by at least one of a batch annealing method, a rapid thermal annealing method, a spike rapid thermal annealing method, and a flash rapid thermal annealing method.

Figure 1E:
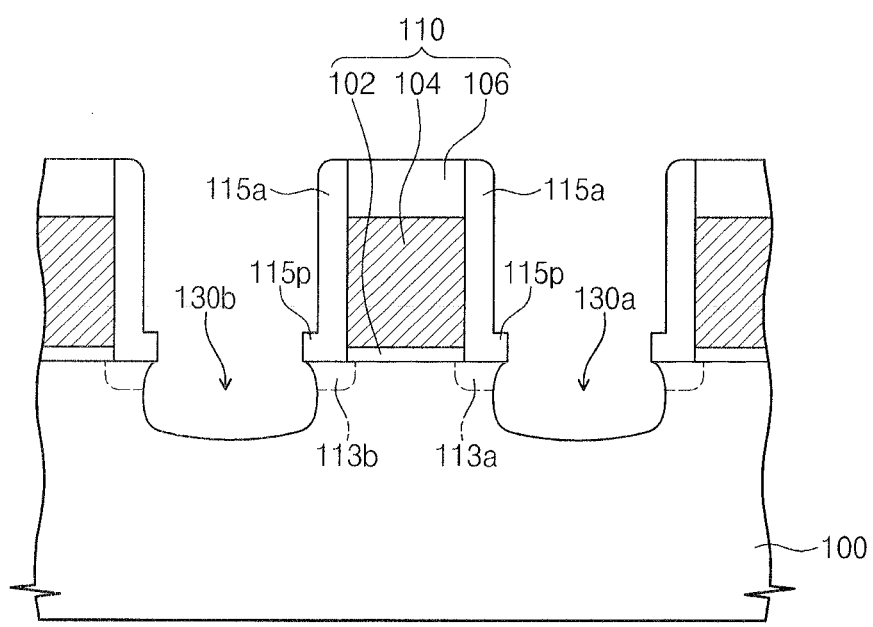

Referring to FIGS. 1E and 2, the first phase change region 127a and the second phase change region 127b may be removed to form a first concave region 130a and a second concave region 130b, respectively (S160).

The first and second phase change regions 127a and 127b may be removed by a wet etching process. As a result, an etch selectivity between the phase change regions 127a and 127b and the semiconductor substrate 100 can be improved. Additionally, an etch selectivity between the phase change regions 127a and 127b and the gate spacers 115a can be improved. In some embodiments, a ratio of an etch rate of the phase change regions 127a and 127b to an etch rate of the semiconductor substrate 100 by the wet etching process may be within a range of about 50:1 to about 300:1. Additionally, a ratio of the etch rate of the phase change regions 127a and 127b to an etch rate of the gate spacers 115a by the wet etching process may be within a range of about 10:1 to about 100:1. The first and second phase change regions 127a and 127b may be substantially isotropically etched by the wet etching process. In some embodiments, an etch selectivity between the phase change regions 127a and 127b and the hard mask pattern 106 can be improved by the wet etching process. When the hard mask pattern 106 includes the same material as the gate spacers 115a, a ratio of the etch rate of the phase change regions 127a and 127b to an etch rate of the hard mask pattern 106 by the wet etching process may be within a range of about 10:1 to about 100:1.

For example, when the semiconductor substrate 100 is the silicon substrate and the gate spacers 115a include silicon nitride, an etchant of the wet etching process may include a hydrofluoric acid (HF), a nitric acid (HNO$_3$), and an acetic acid (CH$_3$COOH). Additionally, the etchant may further include deionized water. A content ratio of the hydrofluoric acid (HF) in the etchant may be within a range of about 0.3 wt % (weight percentage) to about 1.5 wt %. A content ratio of the nitric acid (HNO$_3$) in the etchant may be within a range of about 40 wt % to about 60 wt %. A content ratio of the acetic acid (CH$_3$COOH) in the etchant may be within a range of about 1 wt % to about 5 wt %. In some embodiments, the etchant may include the hydrofluoric acid (HF) of about 0.7 wt %, the nitric acid (HNO$_3$) of about 50 wt %, the acetic acid (CH$_3$COOH) of about 2.6 wt %, and the deionized water of about 46.7 wt %.

According to the methods of forming the concave regions 130a and 130b described above, the amorphization element ions 120 may be implanted to form the amorphous regions 125a and 125b, and the amorphous regions 125a and 125b may be annealed to form the phase change regions 127a and 127b. The phase change regions 127a and 127b may be removed to form the concave regions 130a and 130b. The phase change regions 127a and 127b formed by the annealing process may be quickly etched in the removal process of the phase change regions 127a and 127b. In other words, an etch rate of the phase change regions 127a and 127b in the removal process may increase. Additionally, the phase change regions 127a and 127b may have a different phase from the semiconductor substrate 100. For example, the phase change regions 127a and 127b may be in the micro-crystalline state. Thus, the etch selectivity between the phase change regions 127a and 127b and the semiconductor substrate 100 can be improved.

Additionally, the phase change regions 127a and 127b may be removed by the wet etching process. Thus, the etch selectivity between the phase change regions 127a and 127b and the semiconductor substrate 100 can be improved. In addition, the etch selectivity between the phase change regions 127a and 127b and the gate spacers 115a can also be improved.

In some embodiments, the amorphization element ions 120 may be implanted at the lower process temperature within the range of about −20 degrees Celsius to about −100 degrees Celsius. In this case, inner surfaces of the concave regions 130a and 130b may be smooth.

Figure 1F:
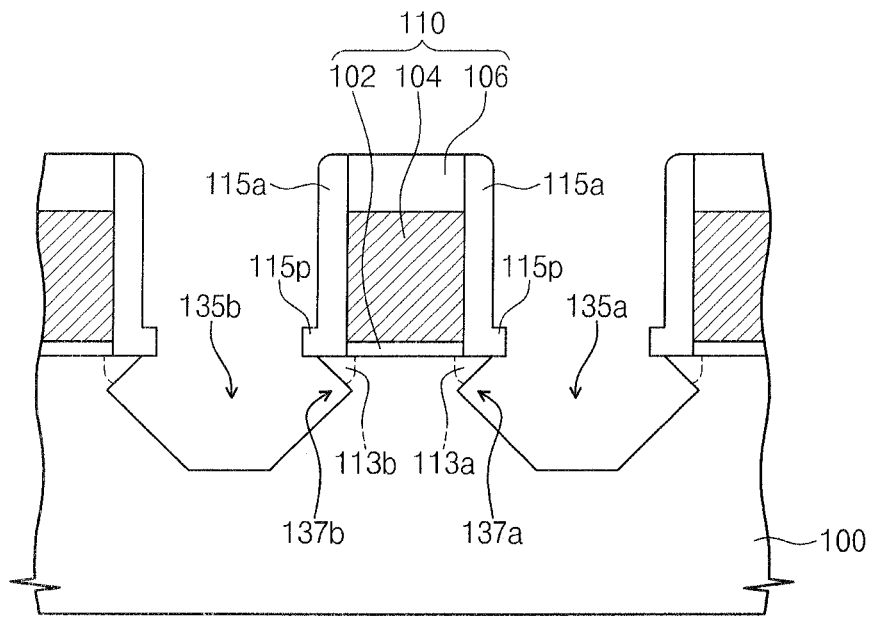

Subsequently, referring to FIG. 1F, an anisotropic wet etching process may be performed on the first and second concave regions 130a and 130b. Thus, first and second recess regions 135a and 135b may be formed. The anisotropic wet etching process may use {111} crystal planes of the semiconductor substrate 100 as etch stop surfaces. In other words, an etch rate of the {111} crystal planes used in the anisotropic wet etching process may be less than those of the other crystal planes of the semiconductor substrate 100. Thus, bottom surfaces and sidewalls of the concave regions 130a and 130b may be etched by the anisotropic wet etching process to form the recess regions 135a and 135b including tapered undercut regions 137a and 137b. The first recess region 135a and the second recess region 135b may include a first tapered undercut region 137a and a second tapered undercut region 137b, respectively. Inner surfaces of the first and second tapered undercut regions 137a and 137b may be included in the {111} crystal planes. In some embodiments, if the semiconductor substrate 100 is the silicon substrate, the anisotropic wet etching process may use an anisotropic etchant including ammonium hydroxide (NH4OH) and/or tetramethyl ammonium hydroxide (TMAH).

The first tapered undercut region 137a of the first recess region 135a may have a shape laterally tapered toward a channel region under the gate pattern 110, and the second tapered undercut region 137b of the second recess region 135b may have a shape laterally tapered toward the channel region. In some embodiments, the first tapered undercut region 137a may be substantially symmetric to the second tapered undercut region 137b with respect to the channel region. However, the inventive concept is not limited thereto.

Figure 1G:
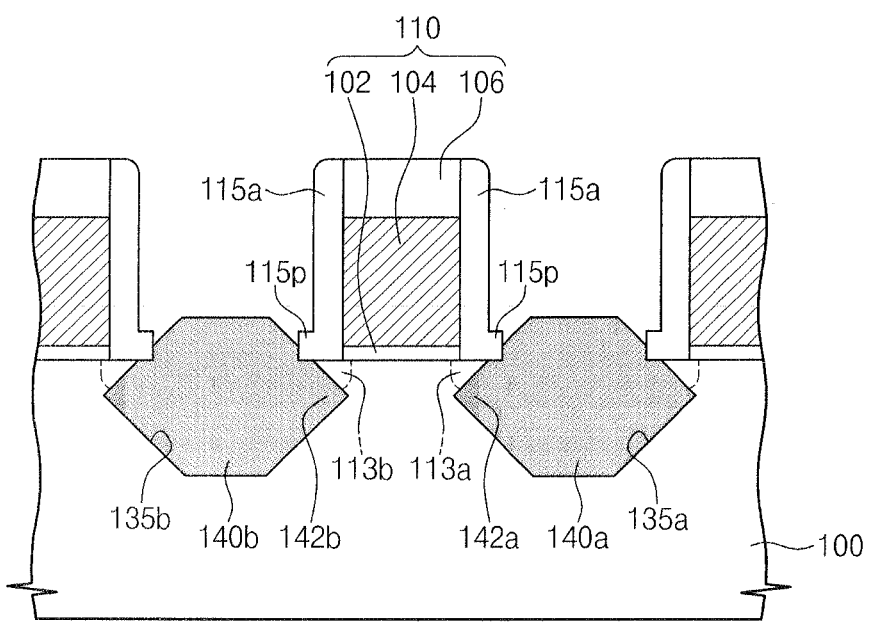

Referring to FIG. 1G, an epitaxial growth process may be performed on the semiconductor substrate 100 having the first and second recess regions 135a and 135b to form first and second epitaxial patterns 140a and 140b. The first and second epitaxial patterns 140a and 140b may fill the first and second recess regions 135a and 135b, respectively. Due to the first and second tapered undercut regions 137a and 137b, the first epitaxial pattern 140a may include a first tapered portion 142a laterally tapered toward the channel region, and the second epitaxial pattern 140b may include a second tapered portion 142b laterally tapered toward the channel region. The first and second tapered portions 142a and 142b may be disposed in the semiconductor substrate 100. In other words, tips of the first and second tapered portions 142a and 142b may be disposed below a top surface of the semiconductor substrate 100 under the gate pattern 110.

The first and second epitaxial patterns 140a and 140b may include a semiconductor element different from the semiconductor element of the semiconductor substrate 100. Accordingly, the first and second epitaxial patterns 140a and 140b may provide a compressive force or a tensile force to the channel region under the gate pattern 110. As a result, when a transistor including the channel region is operated, the mobility of carriers in a channel generated in the channel region can increase. Because the first and second epitaxial patterns 140a and 140b include the first and second tapered portions 142a and 142b, the compressive force or the tensile force provided to the channel region can further increase. As a result, the mobility of the carriers in the channel may further increase.

When the transistor including the channel region is a PMOS transistor, the first and second epitaxial patterns 140a and 140b may provide the compressive force to the channel region. Thus, the mobility of holes in the channel can increase. To provide the compressive force to the channel region, the first and second epitaxial patterns 140a and 140b may include a semiconductor element which has a larger diameter than the semiconductor element of the semiconductor substrate 100. For example, when the semiconductor substrate 100 is the silicon substrate, the first and second epitaxial patterns 140a and 140b may include silicon-germanium (SiGe) or germanium (Ge).

When the transistor including the channel region is an NMOS transistor, the first and second epitaxial patterns 140a and 140b may provide a tensile force to the channel region. Thus, the mobility of electrons in the channel can increase. To provide the tensile force to the channel region, the first and second epitaxial patterns 140a and 140b may include a semiconductor element which has a smaller diameter than the semiconductor element of the semiconductor substrate 100. For example, when the semiconductor substrate 100 is the silicon substrate, the first and second epitaxial patterns 140a and 140b may include silicon carbide (SiC).

In some embodiments, top surfaces of the first and second epitaxial patterns 140a and 140b may be disposed above the top surface of the semiconductor substrate 100 under the gate pattern 110. In this case, due to the protruding portions 115p of the gate spacers 115a, interfaces between the semiconductor substrate 100 and the epitaxial patterns 140a and 140b can be protected. In other words, the protruding portions 115p may cover the ends of the interfaces adjacent to the top surface of the semiconductor substrate 100, so that the interfaces can be protected. As a result, the reliability of the transistor can be improved.

At least a portion of each of the first and second epitaxial patterns 140a and 140b may be doped with dopants of the second conductivity type. In some embodiments, the first and second epitaxial patterns 140a and 140b may be doped by an in-situ method. In this case, each of the first and second epitaxial patterns 140a and 140b may be fully doped with dopants of the second conductivity type. In other embodiments, after the first and second epitaxial patterns 140a and 140b are formed, dopant ions of the second conductivity type may implanted into the epitaxial patterns 140a and 140b using the gate pattern 110 and the gate spacers 115a as masks to dope at least portions of the epitaxial patterns 140a and 140b. In some embodiments, the first source/drain extension 113a and the doped portion of the first epitaxial pattern 140a may be included in a drain region of the transistor, and the second source/drain extension 113b and the doped portion of the second epitaxial pattern 140b may be included in a source region of the transistor.

Subsequently, an interlayer dielectric layer 145 illustrated in FIG. 5 may be formed on the semiconductor substrate 100. First and second contact plugs 147a and 147b penetrating the interlayer dielectric layer 145 may be formed. The first and second contact plugs 147a and 147b may be electrically connected to the first and second epitaxial patterns 140a and 140b, respectively. Thus, the semiconductor device illustrated in FIG. 5 may be realized.

As described with reference to FIGS. 1C and 1D, the amorphous regions 125a and 125b may be fully changed to the phase change regions 127a and 127b. Alternatively, the amorphous regions 125a and 125b may be partially changed. This will described with reference to FIGS. 3A and 3B.

Figure 3A:
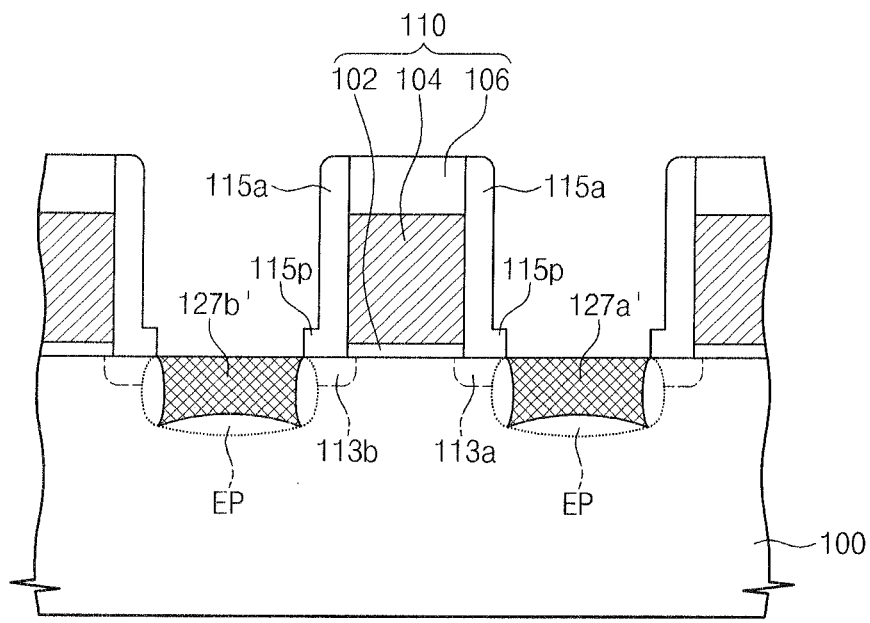
FIGS. 3A and 3B are cross-sectional views illustrating a method of manufacturing a semiconductor device according to an exemplary embodiment of the inventive concept.
Figure 3B:
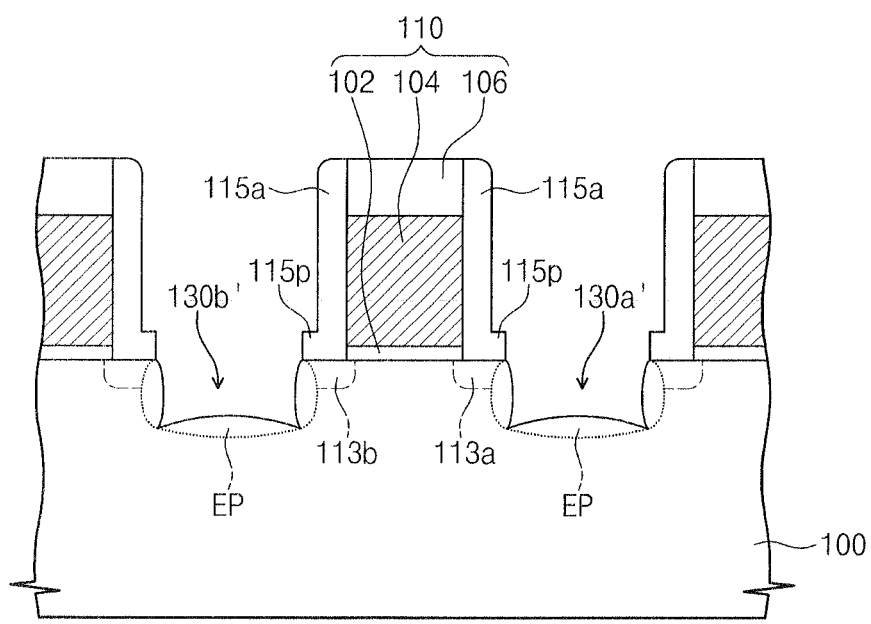

FIGS. 3A and 3B are cross-sectional views illustrating a method of manufacturing a semiconductor device according to an exemplary embodiment of the inventive concept.

Referring to FIGS. 1C and 3A, the annealing process may be performed on the semiconductor substrate 100 including the amorphous regions 125a and 125b. At this time, the process temperature of the annealing process may be within the range of about 450 degrees Celsius to about 650 degrees Celsius. In this case, portions of the first and second amorphous regions 125a and 125b adjacent to the semiconductor substrate 100 may be changed into solid phase epitaxy portions EP, and other portions of the first and second amorphous regions 125a and 125b may be changed into first and second phase change regions 127a' and 127b', respectively.

The solid phase epitaxy portion EP may be formed using the semiconductor substrate 100 adjacent to each of the amorphous regions 125a and 125b as a seed. The solid phase epitaxy portion EP may be in a single-crystalline state like the semiconductor substrate 100. Each of the first and second phase change regions 127a' and 127b' may be in the microcrystalline state described above.

Referring to FIG. 3B, the first and second phase change regions 127a' and 127b' may be removed by the wet etching process described with reference to FIGS. 1E and 2. Thus, first and second concave regions 130a' and 130b' may be formed. At this time, since the solid phase epitaxy portions EP have the same single-crystalline state as the semiconductor substrate 100, the solid phase epitaxy portions EP may remain. Subsequently, the anisotropic wet etching process described with reference to FIG. 1F may be performed to form the first and second recess regions 135a and 135b illustrated in FIG. 1F. Alternatively, since the first and second concave regions 130a' and 130b' according to the present embodiment may have different shapes than the first and second concave regions 130a and 130b illustrated in FIG. 1E, the first and second recess regions according to the present embodiment may have different sizes, different widths, and/or different depths than the first and second recess regions 135a and 135b illustrated in FIG. 1F. Subsequent processes may be performed in the same way as described with reference to FIGS. 1G and 5.

In addition, the gate pattern 110 may include the gate electrode 104. In other words, after the gate electrode 104 is formed, the concave regions 130a and 130b, the recess regions 135a and 135b, and the epitaxial patterns 140a and 140b may formed in order. Alternatively, after the epitaxial patterns 140a and 140b are formed, the gate electrode may be formed. This will be described with reference to FIGS. 4A to 4D.

FIGS. 4A through 4D are cross-sectional views illustrating a method of manufacturing a semiconductor device according to an exemplary embodiment of the inventive concept.

Figure 4A:
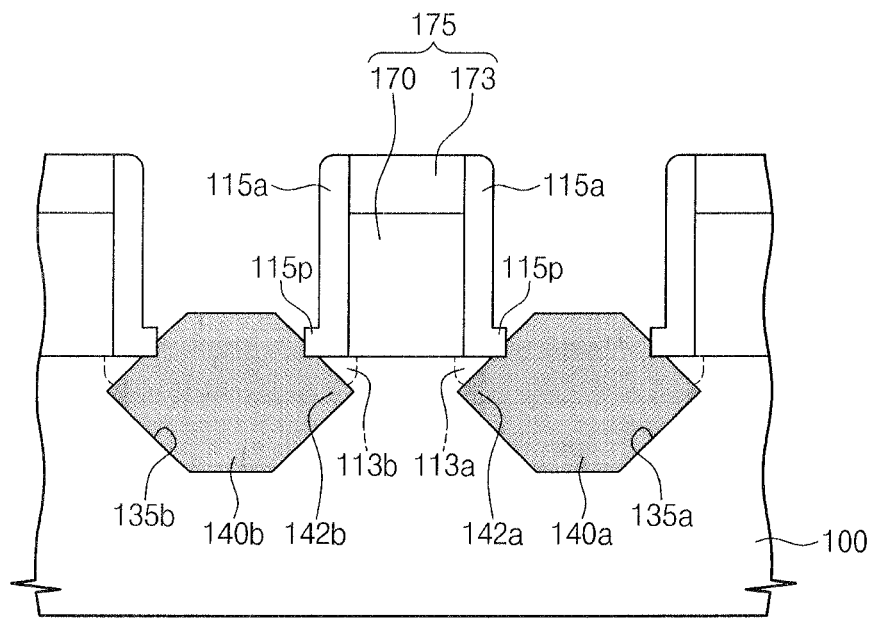
FIGS. 4A through 4D are cross-sectional views illustrating a method of manufacturing a semiconductor device according to an exemplary embodiment of the inventive concept.

Referring to FIG. 4A, a dummy gate pattern 175 may be formed on the semiconductor substrate 100. Subsequently, the formation process of the source/drain extensions 113a and 113b through the formation process of the epitaxial patterns 140a and 140b described with reference to FIGS. 1A through 1F may be performed. The dummy gate pattern 175 may include a material having an etch selectivity with respect to the gate spacers 115a and subsequent lower interlayer dielectric layer. In some embodiments, the dummy gate pattern 175 may include a semiconductor pattern 170 and a capping pattern 173 which are sequentially stacked. When the gate spacers 115a are formed of silicon nitride and the lower interlayer dielectric layer is formed of silicon oxide, the semiconductor pattern 170 may be formed of poly-crystalline silicon and the capping pattern 173 may be formed of silicon oxide. A buffer oxide layer (not shown) may be formed between the dummy gate pattern 175 and the semiconductor substrate 100.

Figure 4B:
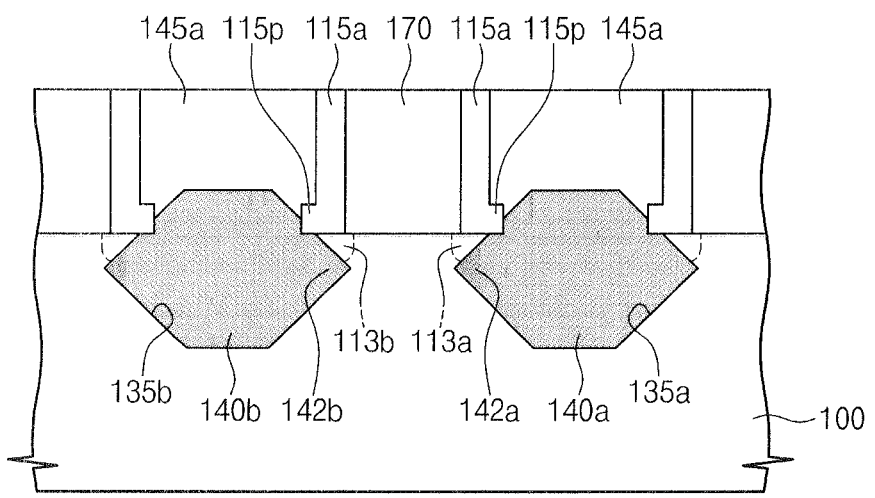

Referring to FIG. 4B, the lower interlayer dielectric layer 145a may be formed on the semiconductor substrate 100 including the epitaxial patterns 140a and 140b and the dummy gate pattern 175. Subsequently, the lower interlayer dielectric layer 145a and the capping pattern 173 may be planarized until the semiconductor pattern 170 of the dummy gate pattern 175 is exposed. The lower interlayer dielectric layer 145a and the capping pattern 173 may be planarized by a chemical mechanical polishing (CMP) process. Upper portions of the gate spacers 115a may be removed by the planarization process of the lower interlayer dielectric layer 145a and the capping pattern 173. As described above, the semiconductor pattern 170 of the dummy gate pattern 175 may have the etch selectivity with respect to the planarized lower dielectric layer 145a and the gate spacers 115a.

Figure 4C:
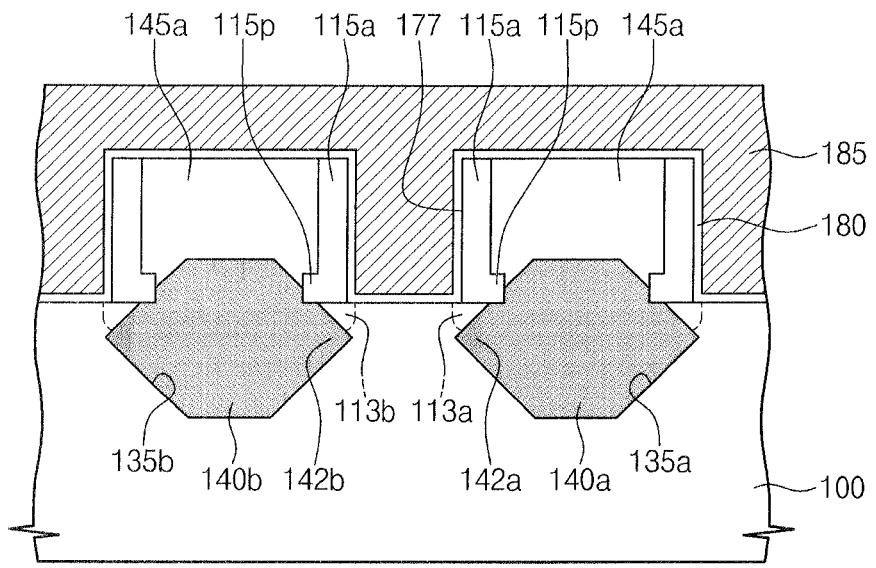

Referring to FIG. 4C, the exposed semiconductor pattern 170 may be removed to form a gate groove 177. If the buffer oxide layer (not shown) is formed, after the exposed semiconductor pattern 170 is removed, the buffer oxide layer may be removed to expose the semiconductor substrate 100 under the gate groove 177. A gate dielectric layer 180 may be formed on the semiconductor substrate 100 including the gate groove 177, and a gate conductive layer 185 may be formed on the gate dielectric layer 180 to fill the gate groove 177. The gate dielectric layer 180 may include an oxide, a nitride, an oxynitride, and/or a high-k dielectric. The gate dielectric layer 180 may be formed by a thermal oxidation process, a nitridation process, an oxy-nitridation process, an ALD process, and/or a CVD process. The gate conductive layer 185 may include a conductive metal nitride (e.g., titanium nitride, and/or tantalum nitride), a transition metal (e.g., titanium and/or tantalum), and/or a metal (e.g., tungsten).

Figure 4D:
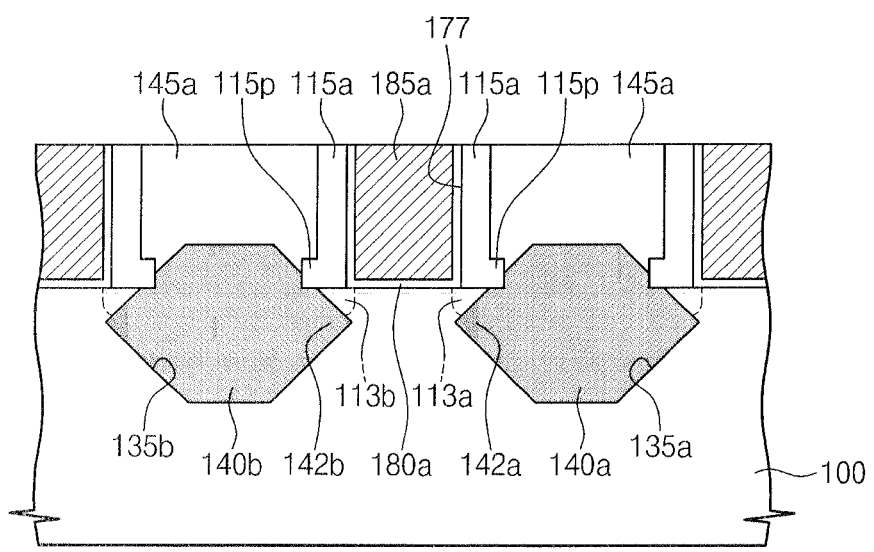

Referring to FIG. 4D, the gate conductive layer 185 may be planarized to form a gate electrode 185a in the gate groove 177. In some embodiments, the gate dielectric layer 180 on the planarized lower interlayer dielectric layer 145a may be removed during the planarization process of the gate conductive layer 185. Thus, a gate dielectric pattern 180a may be formed in the gate groove 177. In the present embodiment, the gate electrode 185a may be formed as a metal gate. Subsequently, an upper interlayer dielectric layer 190 illustrated in FIG. 6 may be formed. First and second contact plugs 147a and 147b penetrating the upper interlayer dielectric layer 190 and the planarized lower interlayer dielectric layer 145a may be formed. Thus, a semiconductor device illustrated in FIG. 6 may be realized.

Figure 5:
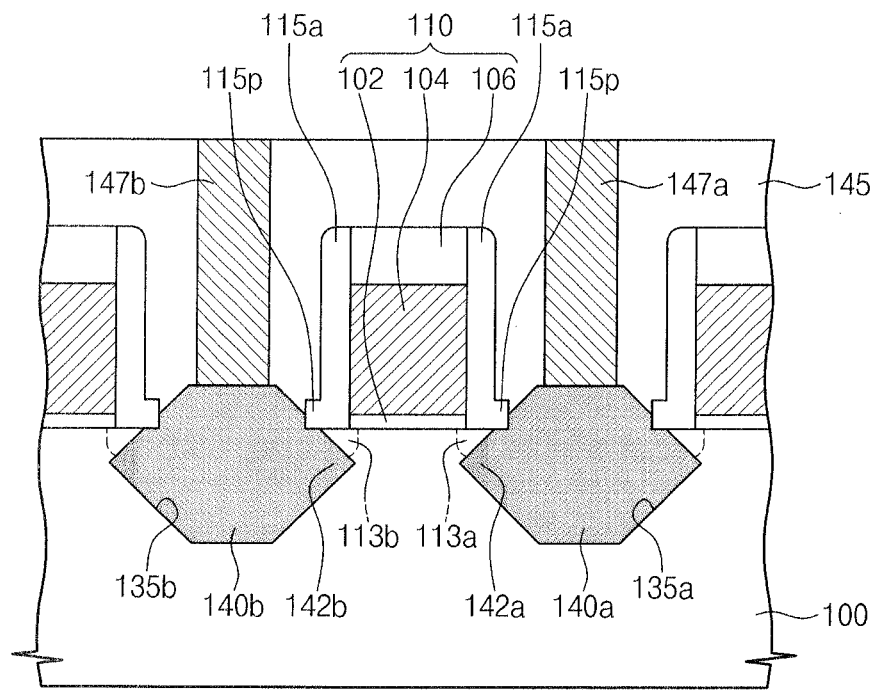
FIG. 5 is a cross-sectional view illustrating a semiconductor device according to an exemplary embodiment of the inventive concept.

FIG. 5 is a cross-sectional view illustrating a semiconductor device according to an exemplary embodiment of the inventive concept. The semiconductor device of FIG. 5 may be fabricated according to the methods of FIGS. 1A through 1G.

Referring to FIG. 5, the gate pattern 110 may be disposed on the semiconductor substrate 100. The first and second epitaxial patterns 140a and 140b may fill the first and second recess regions 135a and 135b formed in the semiconductor substrate 100 at both sides of the gate pattern 110, respectively. The gate pattern 110 may include the gate dielectric pattern 102, the gate electrode 104, and the hard mask pattern 106. The first and second epitaxial patterns 140a and 140b may be adjacent to both sidewalls of the gate pattern 110. Thus, one transistor may include the first and second epitaxial patterns 140a and 140b and the gate pattern 110 disposed on the semiconductor substrate 100 between the first and second epitaxial patterns 140a and 140b.

As described with reference to FIG. 1G, the first and second epitaxial patterns 140a and 140b may include a semiconductor element different from that of the semiconductor substrate 100. Thus, the first and second epitaxial patterns 140a and 140b may provide the compressive force or the tensile force to the channel region under the gate pattern 110. The first epitaxial pattern 140a may include the first tapered portion 142a tapered toward the channel region and the second epitaxial pattern 140b may include the second tapered portion 142b tapered toward the channel region. The first and second tapered portions 142a and 142b may include inclined surfaces which are included in the {111} crystal planes. In some embodiments, the first tapered portion 142a may be substantially symmetric to the second tapered portion 142b with respect to the channel region. In other words, the first tapered portion 142a may be substantially symmetric to the second tapered portion 142b about an imaginary vertical line which passes through a center of the channel region and is perpendicular to the top surface of the semiconductor substrate 100. The first and second epitaxial patterns 140a and 140b may include the materials described with reference to FIG. 1G.

The gate spacers 115a may be disposed on both sidewalls of the gate pattern 110, respectively. Each of the gate spacers 115a may include the protruding portion 115p laterally extending from a lower portion thereof. One gate spacer 115a on one sidewall of the gate pattern 110 may be substantially symmetric to another gate spacer 115a on another sidewall of the gate pattern 110 with respect to the gate pattern 110. Due to the protruding portions 115p of the gate spacers 115a, the interfaces between the epitaxial patterns 140a and 140b and the semiconductor substrate 100 can be protected. Upper surfaces of the first and second epitaxial patterns 140a and 140b may be disposed above the top surface of the semiconductor substrate 100.

The interlayer dielectric layer 145 may cover the gate pattern 110, gate spacers 115a, and the epitaxial patterns 140a and 140b. The first and second contact plugs 147a and 147b may penetrate the interlayer dielectric layer 145 to be connected to top surfaces of the first and second epitaxial patterns 140a and 140b, respectively. Each of the contact plugs 147a and 147b may include an ohmic pattern contacting each of the epitaxial patterns 140a and 140b. The contact plugs 147a and 147b may include a metal (e.g., tungsten), a conductive metal nitride (e.g., titanium nitride, and/or tantalum nitride), and/or a transition metal (e.g., titanium, and/or tantalum). Even though not shown, interconnections may be disposed on the interlayer dielectric layer 145 to be connected to the contact plugs 147a and 147b. In some embodiments, at least one of the first and second contact plugs 147a and 147b may be omitted.

Figure 6:
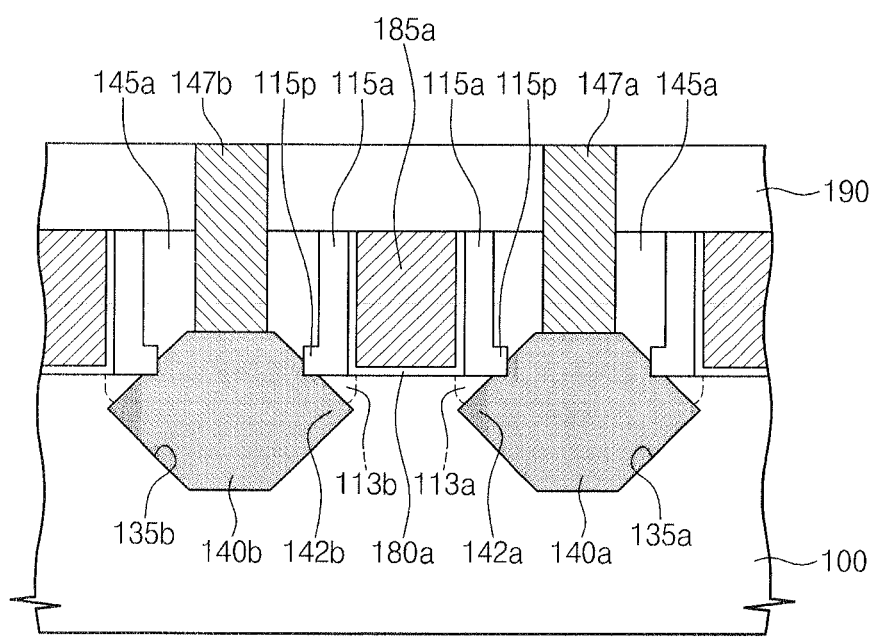
FIG. 6 is a cross-sectional view illustrating a semiconductor device according to an exemplary embodiment of the inventive concept.

FIG. 6 is a cross-sectional view of a semiconductor device according to an exemplary embodiment of the inventive concept. The semiconductor device of FIG. 6 may be fabricated according to the methods of FIGS. 1A through 1G, except that after the epitaxial patterns 140a and 140b are formed, the gate electrode may be formed as shown in FIGS. 4A through 4D.

Referring to FIG. 6, the gate electrode 185a may be disposed over the channel region between the first and second epitaxial patterns 140a and 140b, and the gate dielectric pattern 180a may be disposed between the gate electrode 185a and the semiconductor substrate 100. In FIG. 6, the gate dielectric pattern 180a may extend to cover both sidewalls of the gate electrode 185a. In this case, the extension of the gate dielectric pattern 180a may be disposed between the gate electrode 185a and the gate spacers 115a. The lower interlayer dielectric layer 145a may cover the epitaxial patterns 140a and 140b. The lower interlayer dielectric layer 145a may not cover a top surface of the gate electrode 185a. The upper interlayer dielectric layer 190 may cover the lower interlayer dielectric layer 145a and the top surface of the gate electrode 185a. The first and second contact plugs 147a and 147b may successively penetrate the upper and lower interlayer dielectric layers 190 and 145a to be connected to the first and second epitaxial patterns 140a and 140b, respectively.

FIGS. 7A through 7E are cross-sectional views illustrating a method of manufacturing a semiconductor device according to an exemplary embodiment of the inventive concept.

Figure 7A:
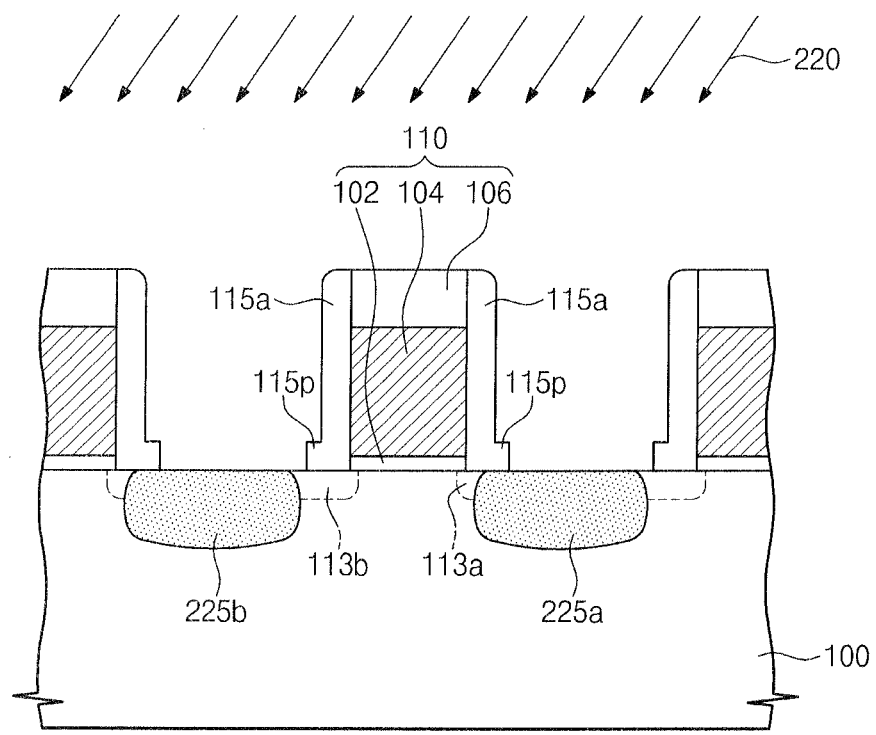
FIGS. 7A through 7E are cross-sectional views illustrating a method of manufacturing a semiconductor device according to an exemplary embodiment of the inventive concept.

Referring to FIG. 7A, amorphization element ions 220 may be implanted into the semiconductor substrate 100 using the gate pattern 110 and the gate spacers 115a as masks. Thus, a first amorphous region 225a and a second amorphous region 225b may be formed in the semiconductor substrate 100 at both sides of the gate pattern 110, respectively. The amorphization element ions 220 may be implanted by a tilt implantation method.

Due to the tilt implantation method, the amorphization element ions 220 may be implanted to be tilted with respect to the top surface of the semiconductor substrate 100. A tilt implantation direction of the tilt implantation method may be non-vertical and non-parallel with respect to the top surface of the semiconductor substrate 100. In some embodiments, an angle between a vertical line that is perpendicular to the top surface of the semiconductor substrate 100 and the tilt implantation direction may be greater than 0 degrees, and equal to or less than about 70 degrees. In particular, the angle between the vertical line and the tilt implantation direction may be greater than about 7 degrees, and equal to or less than about 45 degrees. In the present embodiment, the amorphization element ions 220 may be implanted in one tilt implantation direction. Thus, the first amorphous region 225a may be formed to be asymmetric to the second amorphous region 225b about the channel region under the gate pattern 110. In other words, the first amorphous region 225a may be asymmetric to the second amorphous region 225b about an imaginary vertical line which is perpendicular to the top surface of the semiconductor substrate 100 and passes through the center of the channel region.

In some embodiments, the first amorphous region 225a may be disposed to be closer to the channel region as compared with the second amorphous region 225b. The second amorphous region 225b may be disposed to be farther from the channel region as compared with the first amorphous region 225a.

The amorphization element of the amorphization element ions 220 may include at least one of the amorphization elements used as the amorphization element ions 120 described with reference to FIGS. 1C and 2. A dose and an implantation energy of the amorphization element ions 220 may be the same as the dose and the implantation energy of the amorphization element ions 120 described with reference to FIG. 1C, respectively.

In some embodiments, the amorphization element ions 220 may be implanted at room temperature. Alternatively, as described with reference to FIGS. 1C and 2, the amorphization element ions 220 may be implanted at the lower process temperature within the range of about −20 degrees Celsius to about −100 degrees Celsius.

Figure 7B:
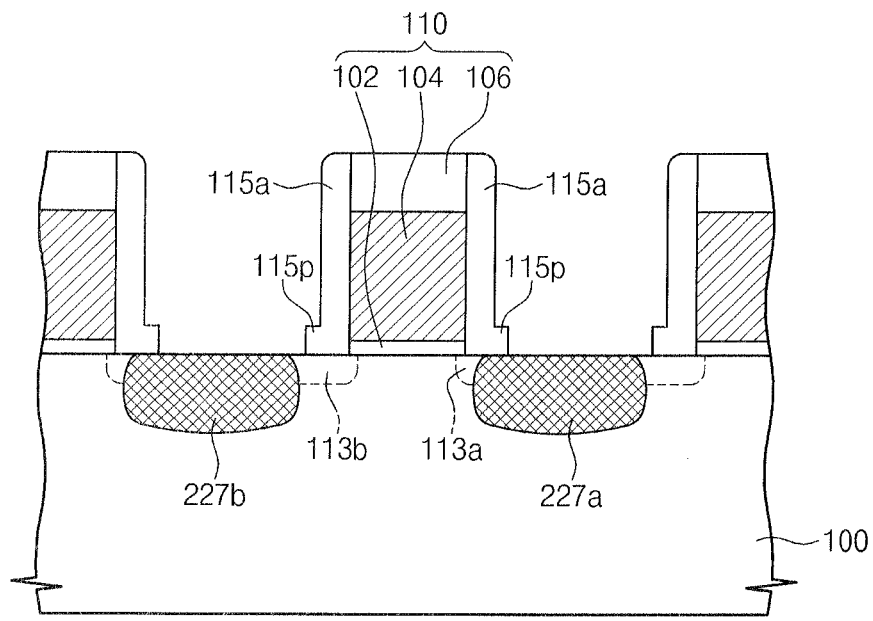

Referring to FIG. 7B, an annealing process may be performed on the semiconductor substrate 100 including the first and second amorphous regions 225a and 225b to form first and second phase change regions 227a and 227b. The annealing process may be performed in the same manner as the annealing process described with reference to FIGS. 1D, 2, and 3A. Thus, the first and second amorphous regions 225a and 225b may be fully or partially changed to form the first and second phase change regions 227a and 227b. Each of the first and second phase change regions 227a and 227b may be in the micro-crystalline state described above.

Figure 7C:
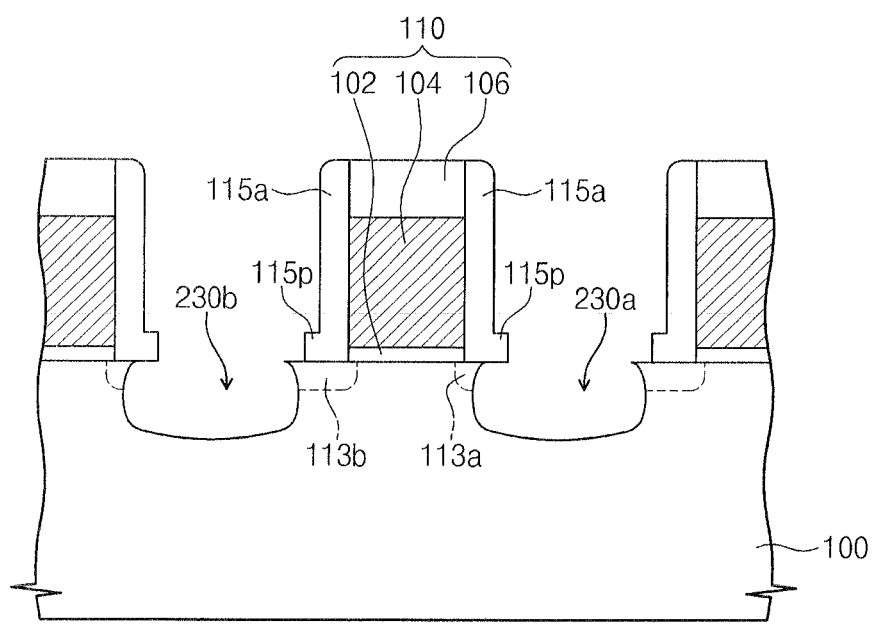

Referring to FIG. 7C, the first and second phase change regions 227a and 227b may be removed to form first and second concave regions 230a and 230b. The first and second phase change regions 227a and 227b may be removed by the wet etching process described with reference to FIGS. 1E and 2. Due to the arrangement of the first and second amorphous regions 225a and 225b, the first concave region 230a may be asymmetric to the second concave region 230b about the channel region.

Figure 7D:
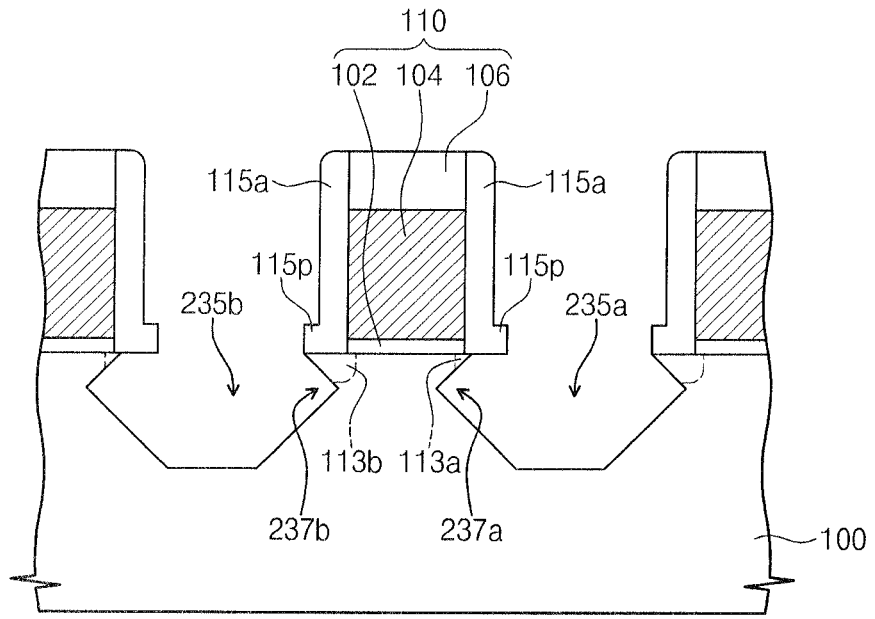

Referring to FIG. 7D, the anisotropic wet etching process described with reference to FIG. 1F may be performed on the first and second concave regions 230a and 230b to form first and second recess regions 235a and 235b. The first recess region 235a may include a first tapered undercut region 237a laterally tapered toward the channel region, and the second recess region 235b may include a second tapered undercut region 237b laterally tapered toward the channel region. At this time, the first recess region 235a may be asymmetric to the second recess region 235b about the channel region. In particular, the first tapered undercut region 237a may be asymmetric to the second tapered undercut region 237b about the channel region.

Figure 7E:
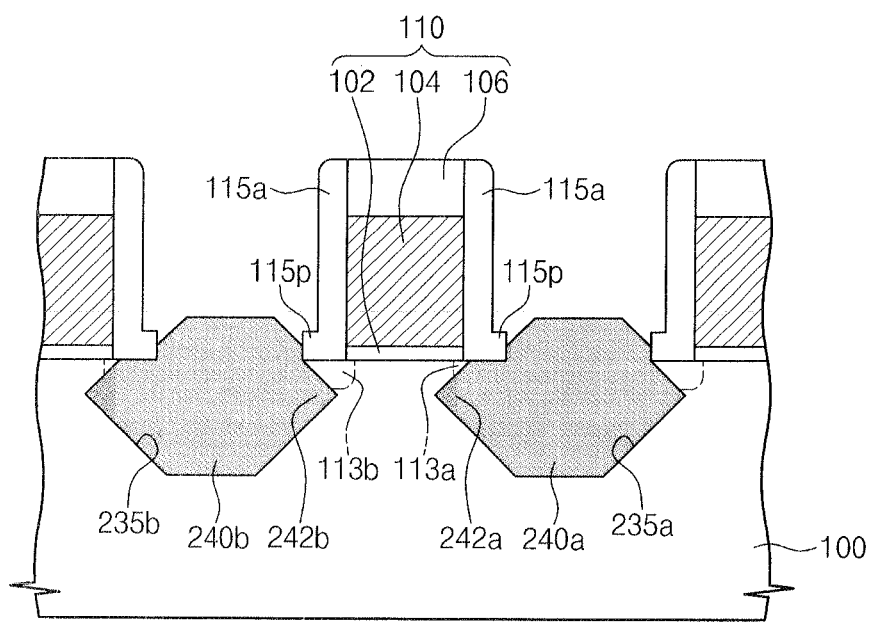

Referring to FIG. 7E, an epitaxial process may be performed to form first and second epitaxial patterns 240a and 240b filling the first and second recess regions 235a and 235b, respectively. The first and second epitaxial patterns 240a and 240b may be formed of the same material as the first and second epitaxial patterns 140a and 140b described with reference to FIG. 1G. Additionally, the first and second epitaxial patterns 240a and 240b may be doped by the same methods used for doping the epitaxial patterns 140a and 140b described with reference to FIG. 1G.

Due to the first and second tapered undercut regions 237a and 237b, the first epitaxial pattern 240a may include a first tapered portion 242a laterally tapered toward the channel region, and the second epitaxial pattern 240b may include a second tapered portion 242b laterally tapered toward the channel region. The first tapered portion 242a may be asymmetric to the second tapered portion 242b about the channel region.

In the present embodiment, the amorphization element ions 220 may be implanted into the semiconductor substrate 100 by the tilt implantation method. Thus, the first amorphous region 225a may be asymmetric to the second amorphous region 225b about the channel region. As a result, the first tapered portion 242a of the first epitaxial pattern 240a can be asymmetric to the second tapered portion 242b of the second epitaxial pattern 240b about the channel region. Thus, the reliability of a transistor which includes the first and second epitaxial patterns 240a and 240b and the gate pattern 110 disposed between the first and second epitaxial patterns 240a and 240b may be improved. This will be described in more detail later.

Further, in the present embodiment in which the first amorphous region 225a is asymmetric to the second amorphous region 225b about the channel region, the removal process used in the formation of the concave regions 230a and 230b may be performed by other methods. In some embodiments, the phase change regions 227a and 227b may be removed by an isotropic dry etching process. In other embodiments, the annealing process may be omitted and the first and second amorphous regions 225a and 225b may be removed by the isotropic dry etching process to form the first and second concave regions 230a and 230b.

In some embodiments, the dummy gate pattern 175, which is described with reference to FIGS. 4A through 4D, may also be applied to the method of manufacturing the semiconductor device according to the present embodiment.

A semiconductor device manufactured according to the present embodiment will be described with reference to FIGS. 8A and 8B.

Figure 8A:
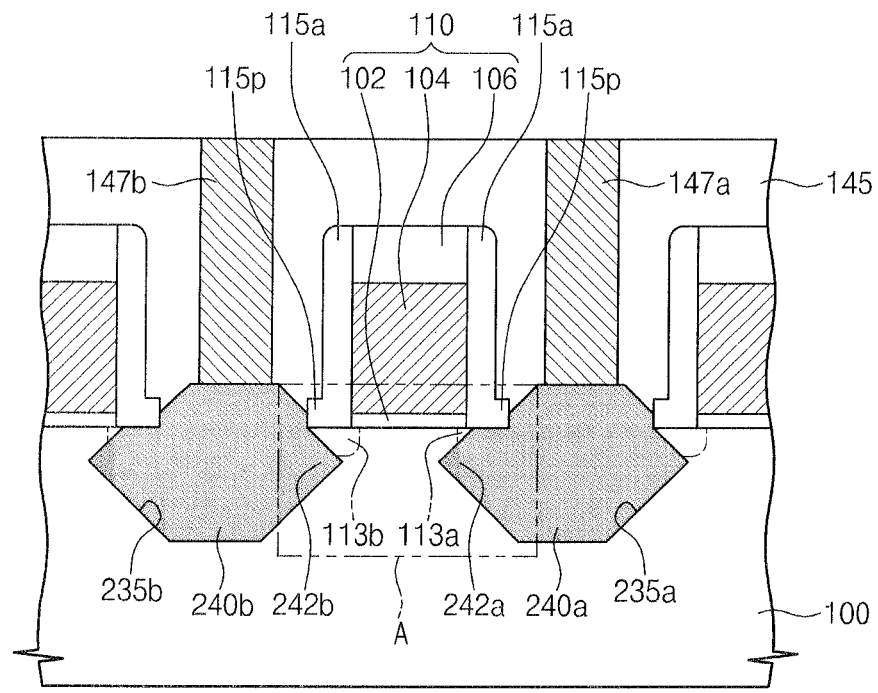
FIG. 8A is a cross-sectional view illustrating a semiconductor device according to an exemplary embodiment of the inventive concept.
Figure 8B:
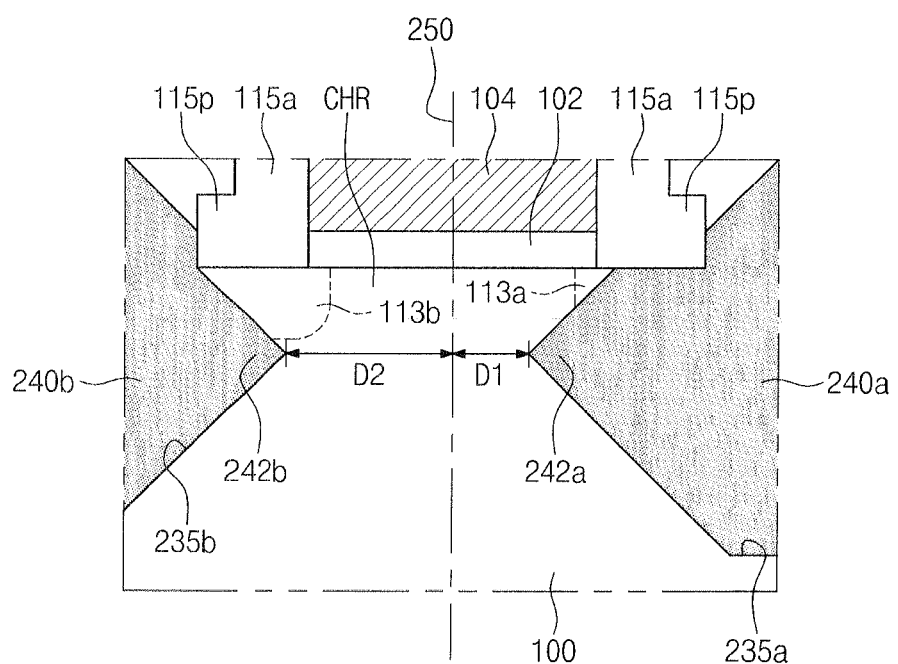
FIG. 8B is an enlarged view of a portion 'A' of FIG. 8A.

FIG. 8A is a cross-sectional view illustrating a semiconductor device according to an exemplary embodiment of the inventive concept, and FIG. 8B is an enlarged view of a portion 'A' of FIG. 8A.

Referring to FIGS. 8A and 8B, the first epitaxial pattern 240a and the second epitaxial pattern 240b may fill the first recess region 235a and the second recess region 235b formed in the semiconductor substrate 100 at both sides of the gate pattern 110, respectively. The first and second epitaxial patterns 240a and 240b may be adjacent to both sides of the gate pattern 110. Thus, the first and second epitaxial patterns 240a and 240b and the gate pattern 110 on the semiconductor substrate 100 therebetween may be included in a transistor.

The first tapered portion 242a of the first epitaxial pattern 240a may be asymmetric to the second tapered portion 242b of the second epitaxial pattern 240b about the channel region CHR under the gate pattern 110. In more detail, as illustrated in FIG. 8B, the first tapered portion 242a may be asymmetric to the second tapered portion 242b about an imaginary vertical line 250 which passes through a center of the channel region CHR and is perpendicular to a top surface of the semiconductor substrate 100. A first horizontal distance D1 between a tip of the first tapered portion 242a and the center of the channel region CHR may be different from a second horizontal distance D2 between a tip of the second tapered portion 242b and the center of the channel region CHR. As illustrated in FIG. 8B, the first horizontal distance D1 may correspond to the shortest distance between the tip of the first tapered portion 242a and the imaginary vertical line 250, and the second horizontal distance D2 may correspond to the shortest distance between the tip of the second tapered portion 242b and the imaginary vertical line 250.

In some embodiments, the first horizontal distance D1 may be less than the second horizontal distance D2. In this case, the doped portion of the first epitaxial pattern 240a and the first source/drain extension 113a may correspond to a drain region of the transistor, and the doped portion of the second epitaxial pattern 240b and the second source/drain extension 113b may correspond to a source region of the transistor. Due to the first tapered portion 242a, the compressive force or the tensile force may be sufficiently provided to a portion of the channel region CHR adjacent to the drain region. Thus, a potential barrier of the portion of the channel region CHR adjacent to the drain region may become lower. As a result, a turn-on current of the transistor may be improved. The second tapered portion 242b may be farther from the channel region CHR as compared with the first tapered portion 242a. Thus, a punch-through characteristic between the source region and the drain region (e.g., a punch-through characteristic between the first and second tapered portions 242a and 242b) can be improved. Additionally, the second tapered portion 242b may also provide the compressive force or the tensile force to the channel region CHR. As a result, the turn-on current of the transistor including the first and second tapered portions 242a and 242b may be improved and the punch-through characteristic of the transistor may be improved.

In some embodiments, the first tapered portion 242a may be overlapped with the gate pattern 110, while the second tapered portion 242b may not be overlapped with the gate pattern 110 when viewed from a plan view. However, the inventive concept is not limited thereto.

In some embodiments, the tip of the first tapered portion 242a may be disposed at substantially the same distance from the top surface of the semiconductor substrate 100 under the gate pattern 110 as the tip of the second tapered portion 242b. However, the inventive concept is not limited thereto.

In some embodiments, the gate dielectric pattern 180a and the gate electrode 185a illustrated in FIG. 6 may be replaced with the gate pattern 110 illustrated in FIGS. 8A and 8I3.

FIGS. 9A through 9E are cross-sectional views illustrating a method of manufacturing a semiconductor device according to an exemplary embodiment of the inventive concept. The gate pattern 110 of the present embodiment may by fabricated using the processes described with reference to FIGS. 1A and 1B.

Figure 9A:
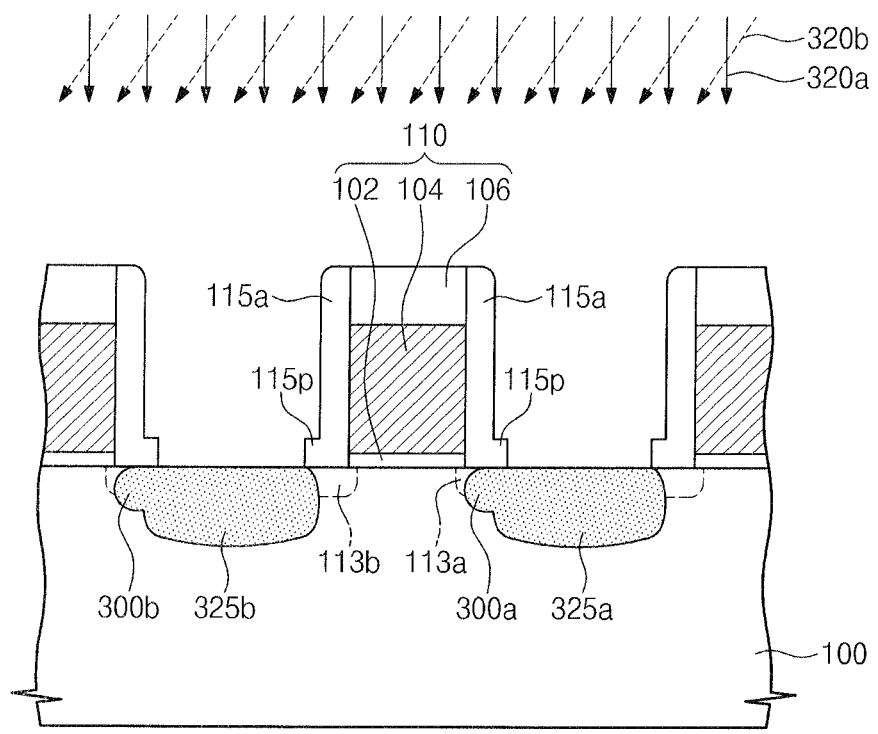
FIGS. 9A through 9E are cross-sectional views illustrating a method of manufacturing a semiconductor device according to an exemplary embodiment of the inventive concept.

Referring to FIG. 9A, first amorphization element ions 320a may be implanted into the semiconductor substrate 100 using the gate pattern 110 and the gate spacers 115a as masks. The first amorphization element ions 320a may be implanted by a vertical implantation method. Second amorphization element ions 320b may be implanted into the semiconductor substrate 100 using the gate pattern 110 and the gate spacers 115a as masks. The second amorphization element ions 320b may be implanted by a tilt implantation method. Due to the first and second amorphization element ions 320a and 320b, a first amorphous region 325a and a second amorphous region 325b may be formed in the semiconductor substrate 100 at both sides of the gate pattern 110, respectively.

An implantation direction of the first amorphization element ions 320a may be substantially the same as that of the amorphization element ions 120 described with reference to FIGS. 1C and 2. An implantation direction of the second amorphization element ions 320b may be substantially the same as that of the amorphization element ions 220 described with reference to FIG. 7A. An implantation energy of the first amorphization element ions 320a may be greater than that of the second amorphization element ions 320b.

The first amorphous region 325a may include a first sidewall and a second sidewall which are opposite to each other. Similarly, the second amorphous region 325b may include a first sidewall and a second sidewall which are opposite to each other. The first sidewalls of the first and second amorphous regions 325a and 325b may be adjacent to the channel region between the first and second amorphous regions 325a and 325b. Due to the second amorphization element ions 320b, an upper portion of the first sidewall of the first amorphous region 325a may laterally protrude toward the channel region more than a lower portion of the first sidewall of the first amorphous region 325a. Thus, the first amorphous region 325a may include a tilt implantation region 300a protruding toward the channel region. On the other hand, since the second amorphization element ions 320b are implanted in one tilted direction, an upper portion of the first sidewall of the second amorphous region 325b may not protrude toward the channel region. As a result, the first sidewall of the first amorphous region 325a may have a structure which is asymmetric to the first sidewall of the second amorphous region 325b about the channel region between the first and second amorphous regions 325a and 325b.

In some embodiments, due to the second amorphization element ions 320b, an upper portion of the second sidewall of the second amorphous region 325b may laterally protrude, so that the second amorphous region 325b may include a tilt implantation region 300b. The tilt implantation region 300b of the second amorphous region 325b may not influence the channel region between the first and second amorphous regions 325a and 325b. In other embodiments, if the second sidewall of the second amorphous region 325b is in contact with a device isolation pattern (not shown), the tilt implantation region 300b of the second amorphous region 325b may not be formed.

A first amorphization element of the first amorphization element ions 320a may include at least one of the amorphization elements used as the amorphization element ions 120 described with reference to FIGS. 1C and 2. A second amorphization element of the second amorphization element ions 320b may include at least one of the amorphization elements used as the amorphization element ions 120 described with reference to FIGS. 1C and 2. The first amorphization element may be the same as the second amorphization element. Alternatively, the first amorphization element may be different from the second amorphization element. Each dose of the first and second amorphization element ions 320a and 320b may be the same as the dose of the amorphization element ions 120 described with reference to FIG. 1C. The first and second amorphization element ions 320a and 320b may be implanted at room temperature. Alternatively, the first and second amorphization element ions 320a and 320b may be implanted at the lower process temperature within the range of about −20 degrees Celsius to about −100 degrees Celsius.

Figure 9B:
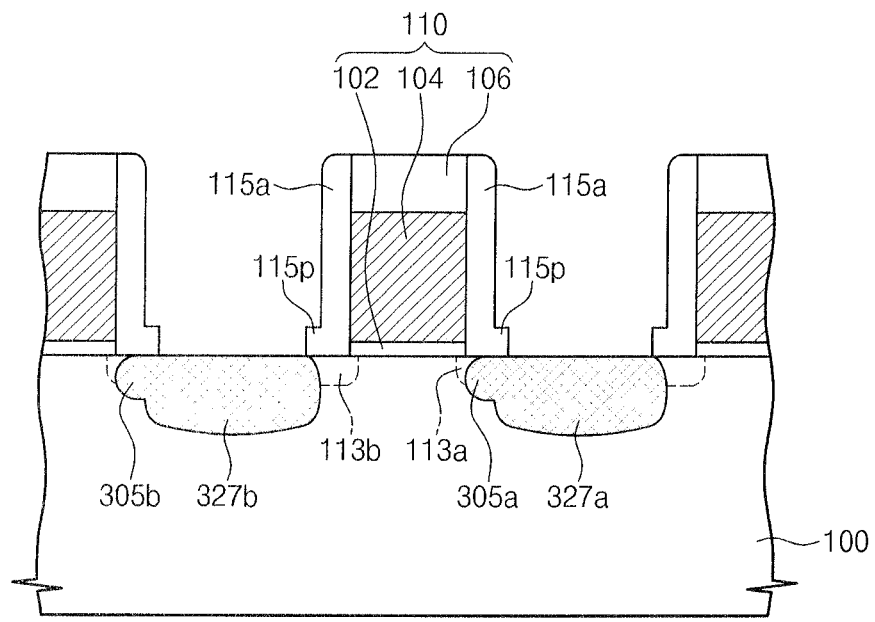

Referring to FIG. 9B, an annealing process may be performed on the semiconductor substrate 100 including the first and second amorphous regions 325a and 325b to form first and second phase change regions 327a and 327b. The annealing process may be performed in the same manner as the annealing process described with reference to FIGS. 1D, 2, and 3A. Thus, the first and second amorphous regions 325a and 325b may be fully or partially changed to the first and second phase change regions 327a and 327b. Each of the first and second phase change regions 327a and 327b may be in the micro-crystalline state described above.

Due to the shapes of the first and second amorphous regions 325a and 325b, a first sidewall of the first phase change region 327a may include a protruding portion 305a protruding toward the channel region between the first and second phase change regions 327a and 327b, while a protruding portion is not formed at a first sidewall of the second phase change region 327b adjacent to the channel region. In some embodiments, due to the tilt implantation region 300b of the second amorphous region 325b, the second phase change region 327b may include a protruding portion 305b formed at a second sidewall of the second phase change region 327b opposite to the first sidewall thereof. Alternatively, the second phase change region 327b may not include the protruding portion 305b.

Figure 9C:
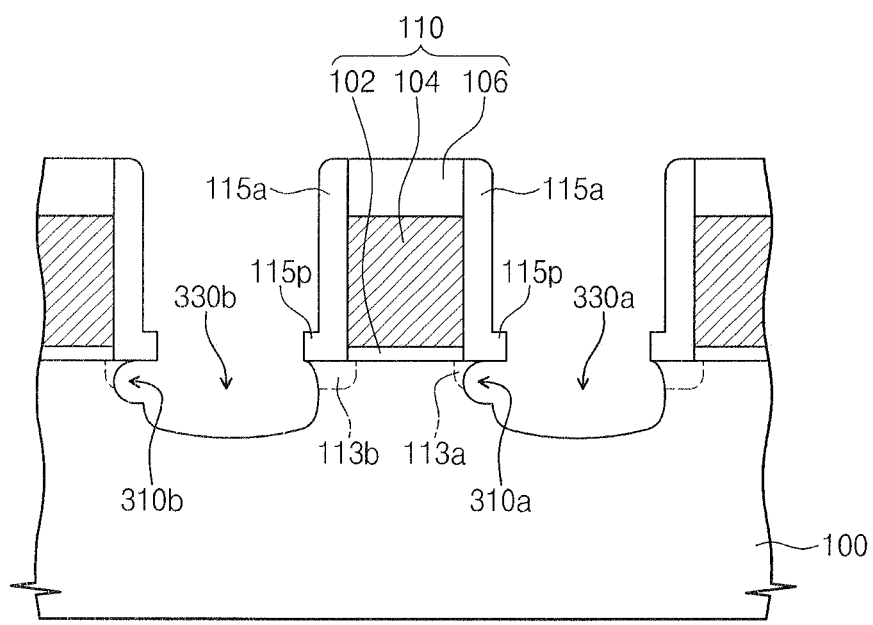

Referring to FIG. 9C, the first and second phase change regions 327a and 327b may be removed to form first and second concave regions 330a and 330b. In some embodiments, the first and second phase change regions 327a and 327b may be removed by the wet etching process described with reference to FIGS. 1E and 2. The first concave region 330a may include an undercut region 310a which is formed by removing the protruding portion 305a of the first phase change region 327a. The undercut region 310a of the first concave region 330a may have a laterally hollowed shape protruding toward the channel region between the first and second concave regions 330a and 330b. In other words, the first concave region 330a may include a first sidewall adjacent to the channel region, and an upper portion of the first sidewall of the first concave region 330a may laterally protrude toward the channel region more than a lower portion of the first sidewall of the first concave region 330a. On the other hand, an undercut region is not formed at a first sidewall of the second concave region 330b adjacent to the channel region between the first and second concave regions 330a and 330b. In some embodiments, an undercut region 310b, which may be formed by removing the protruding portion 305b of the second phase change region 327b, may be formed at a second sidewall of the second concave region 330b opposite to the first sidewall thereof. Alternatively, the second concave region 330b may not include the undercut region 310b.

Figure 9D:
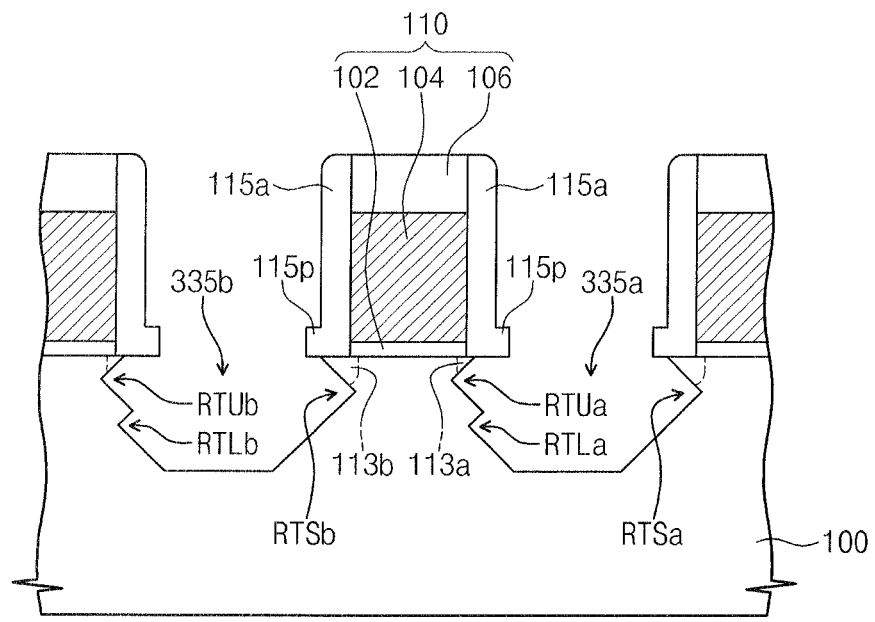

Referring to FIG. 9D, the anisotropic wet etching process described with reference to FIG. 1F may be performed on the first and second concave regions 330a and 330b. As a result, first and second recess regions 335a and 335b may be formed. The first recess region 335a may include a plurality of first tapered undercut regions RTUa and RTLa which are laterally tapered toward the channel region. The plurality of first tapered undercut regions RTUa and RTLa may include an upper tapered undercut region RTUa and a lower tapered undercut region RTLa disposed under the upper tapered undercut region RTUa. An inner sidewall of the undercut region 310a of the first concave region 330a may be etched by the anisotropic wet etching process to form the upper tapered undercut region RTUa, and the lower portion of the first sidewall of the first concave region 330a disposed under the undercut region 310a may be etched by the anisotropic wet etching process to form the lower tapered undercut region RTLa. On the other hand, since an undercut region is not formed at the first sidewall of the second concave region 330b, the second recess region 335b may include one tapered undercut region RTSb tapered toward the channel region. The tapered undercut region RTSb of the second recess region 335b may be referred to as a second tapered undercut region RTSb.

In some embodiments, the first recess region 335a may further include one additional tapered undercut region RTSa opposite to the upper and lower tapered undercut regions RTUa and RTLa. The second recess region 335b may further include a plurality of additional tapered undercut regions RTUb and RTLb opposite to the second tapered undercut region RTSb. In other embodiments, the additional tapered undercut regions RTSa, RTUb, and RTLb of the first and second recess regions 335a and 335b may be omitted.

Figure 9E:
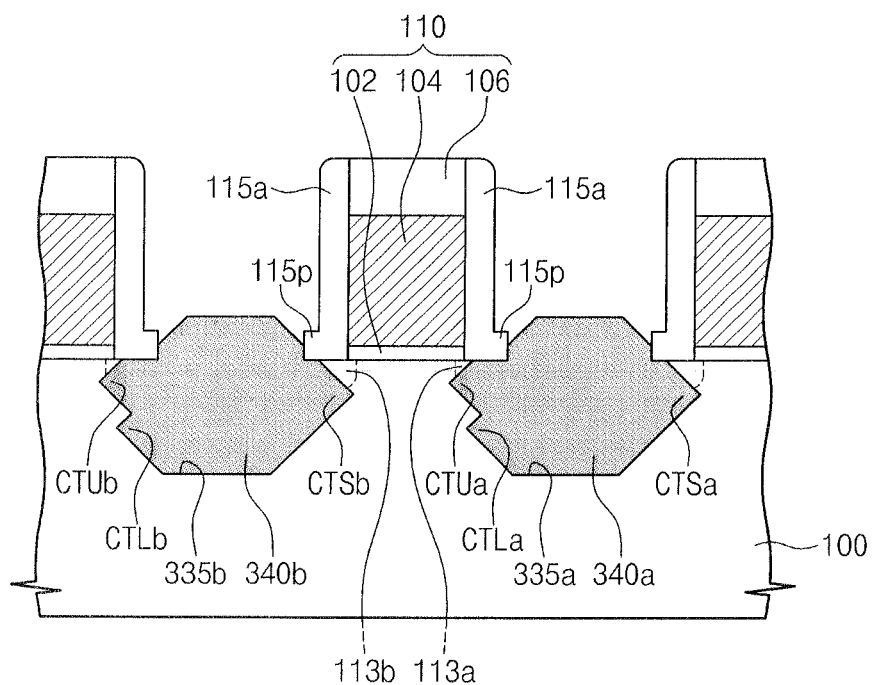

Referring to FIG. 9E, an epitaxial process may be performed to form first and second epitaxial patterns 340a and 340b filling the first and second recess regions 335a and 335b, respectively. The first and second epitaxial patterns 340a and 340b may be formed of the same material as the first and second epitaxial patterns 140a and 140b described with reference to FIG. 1G. Additionally, the first and second epitaxial patterns 340a and 340b may doped by the same methods used for doping the epitaxial patterns 140a and 140b described with reference to FIG. 1G.

Due to the plurality of first tapered undercut regions RTUa and RTLa of the first recess region 335a, the first epitaxial pattern 340a may include a plurality of first tapered portions CTUa and CTLa laterally tapered toward the channel region between the first and second epitaxial patterns 340a and 340b. Due to the second tapered undercut region RTSb of the second recess region 335b, the second epitaxial pattern 340b may include one second tapered portion CTSb laterally tapered toward the channel region between the first and second epitaxial patterns 340a and 340b.

In some embodiments, the first epitaxial pattern 340a may further include an additional tapered portion CTSa filling the additional tapered undercut region RTSa of the first recess regions 335a. The second epitaxial pattern 340b may further include additional tapered portions CTUb and CTLb filling the additional tapered undercut regions RTUb and RTLb of the second recess region 335b, respectively. In other embodiments, the additional tapered portions CTSa, CTUb, and CTLb of the first and second epitaxial patterns 340a and 340b may be omitted.

Subsequently, the interlayer dielectric layer 145 and the contact plugs 147a and 147b illustrated in FIG. 10A may be formed. In some embodiments, the technique described with reference to FIGS. 4A through 4D may be applied to the present embodiment.

In the present embodiment, characteristics of the transistor may be optimized using the vertical implantation method and the tilt implantation method.

In addition, in the present embodiment in which the first amorphous region 325a is asymmetric to the second amorphous region 325b about the channel region, the removal process used in the formation of the concave regions 330a and 330b may be performed by other methods. In some embodiments, the phase change regions 327a and 327b may be removed by an isotropic dry etching process. In other embodiments, the annealing process may be omitted and the first and second amorphous regions 325a and 325b may be removed by the isotropic dry etching process to form the first and second concave regions 330a and 330b.

Next, a semiconductor device manufactured according to the present embodiment will be described with reference to FIGS. 10A and 10B.

Figure 10A:
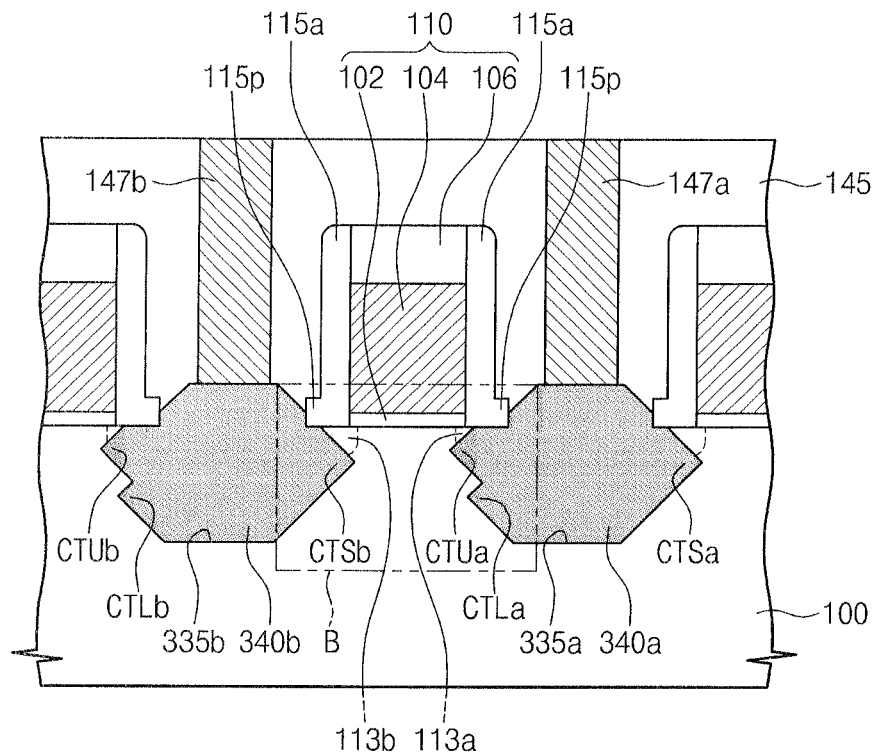
FIG. 10A is a cross-sectional view illustrating a semiconductor device according to an exemplary embodiment of the inventive concept.
Figure 10B:
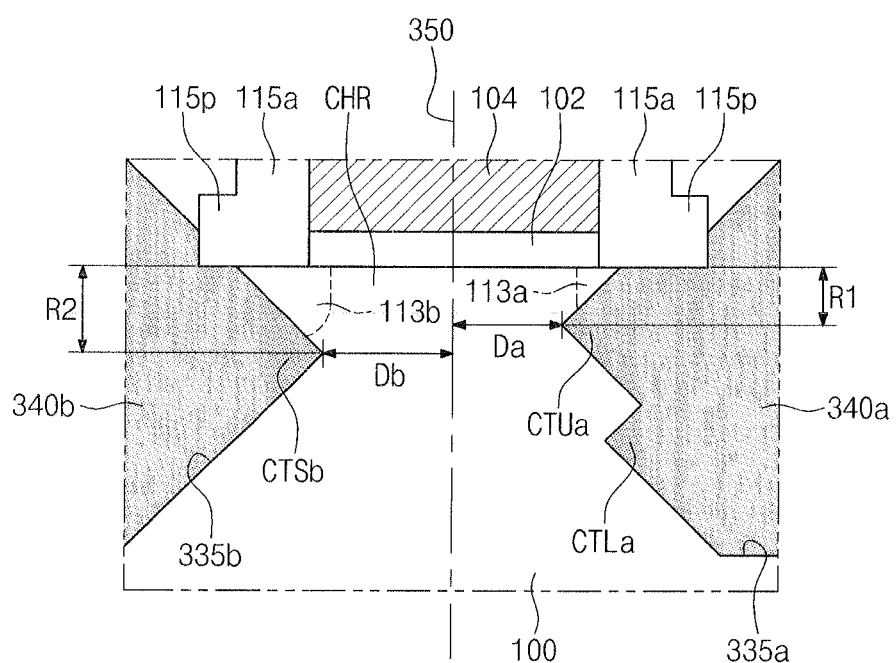
FIG. 10B is an enlarged view of a portion 'B' of FIG. 10A.

FIG. 10A is a cross-sectional view illustrating a semiconductor device according to an exemplary embodiment of the inventive concept, and FIG. 10B is an enlarged view of a portion 'B' of FIG. 10A.

Referring to FIGS. 10A and 10B, the first epitaxial pattern 340a and the second epitaxial pattern 340b may fill the first recess region 335a and the second recess region 335b formed in the semiconductor substrate 100 at both sides of the gate pattern 110, respectively. The first and second epitaxial patterns 340a and 340b may be adjacent to both sides of the gate pattern 110. Thus, the first and second epitaxial patterns 340a and 340b and the gate pattern 110 on the semiconductor substrate 100 therebetween may be included in a transistor. The first epitaxial pattern 340a may be asymmetric to the second epitaxial pattern 340b about the channel region CHR under the gate pattern 110. In other words, the first epitaxial pattern 340a may be asymmetric to the second epitaxial pattern 340b about an imaginary vertical line 350 which passes through a center of the channel region CHR and is perpendicular to a top surface of the semiconductor substrate 100.

As illustrated in FIG. 10B, the first epitaxial pattern 340a may include a plurality of first tapered portions CTUa and CTLa laterally tapered toward the channel region CHR, and the second epitaxial pattern 340b may include one second tapered portion CTSb laterally tapered toward channel region CHR. The first tapered portions CTUa and CTLa may include an upper tapered portion CTUa and a lower tapered portion CTLa.

A first depth R1 of a tip of the upper tapered portion CTUa may be different from a second depth R2 of a tip of the second tapered portion CTSb with respect to the top surface of the semiconductor substrate 100 under the gate pattern 110. Additionally, a depth of a tip of the lower tapered portion CTLa may be different from the second depth R2.

In some embodiments, the first depth R1 may be less than the second depth R2. In this case, the doped portion of the first epitaxial pattern 340a and the first source/drain extension 113a may be included in a drain region of the transistor, and the doped portion of the second epitaxial pattern 340b and the second source/drain extension 113b may be included in a source region of the transistor. Since the first depth R1 is less than the second depth R2, the upper tapered portion CTUa of the first epitaxial pattern 340a may provide sufficient compressive or tensile force to a portion of the channel region CHR adjacent to the drain region. Thus, a potential barrier of the portion of the channel region CHR adjacent to the drain region may decrease, so that the turn-on current of the transistor may increase. Additionally, since the second depth R2 is greater than the first depth R1, a distance between the tip of the second tapered portion CTSb and the tip of the upper tapered portion CTUa may increase, so that the punch-through characteristic between the source region and the drain region may be improved. Additionally, the second tapered portion CTSb may also provide the compressive force or the tensile force to the channel region CHR. Moreover, the lower tapered portion CTLa may provide the compressive force or the tensile force to a lower portion of the channel region CHR. Thus, the mobility of carriers in the channel generated in the channel region CHR may be improved.

In some embodiments, a first horizontal distance Da between the tip of the upper tapered portion CTUa and the center (e.g., the imaginary vertical line 350) of the channel region CHR may be different from a second horizontal distance Db between the tip of the second tapered portion CTSb and the center (e.g., the imaginary vertical line 350) of the channel region CHR. If the doped portion of the first epitaxial pattern 340a is included in the drain region, the first horizontal distance Da may be less than the second horizontal distance Db. A third horizontal distance between the tip of the lower tapered portion CTLa and the imaginary vertical line 350 may be greater than the first horizontal distance Da.

In some embodiments, the gate pattern 110 illustrated in FIG. 10A may be replaced with the gate dielectric pattern 180a and the gate electrode 185a illustrated in FIG. 6.

Figure 11A:
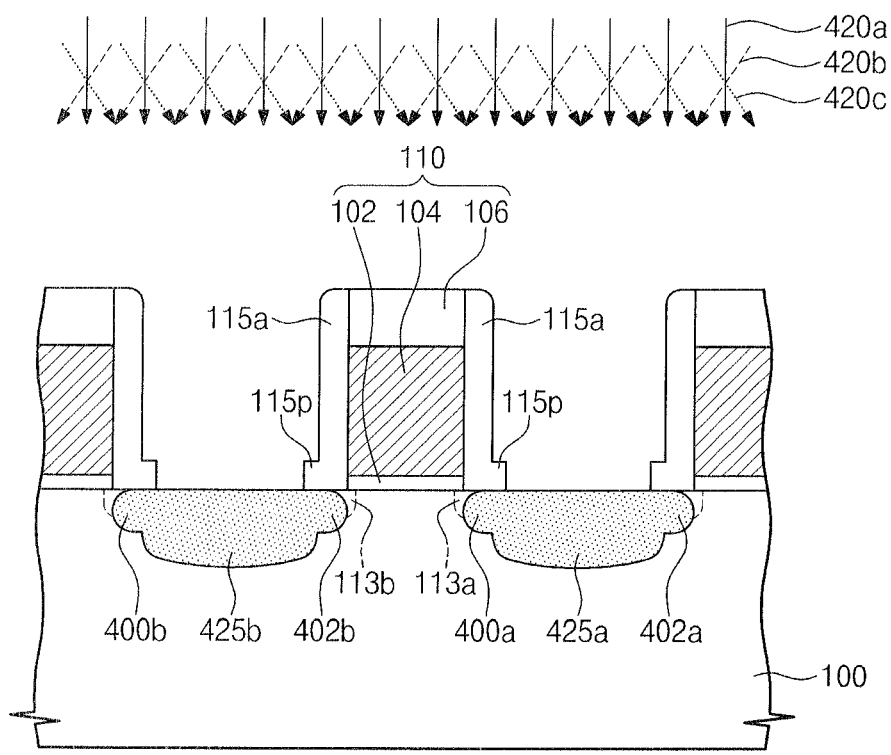
FIGS. 11A through 11E are cross-sectional views illustrating a method of manufacturing a semiconductor device according to an exemplary embodiment of the inventive concept.
Figure 11B:
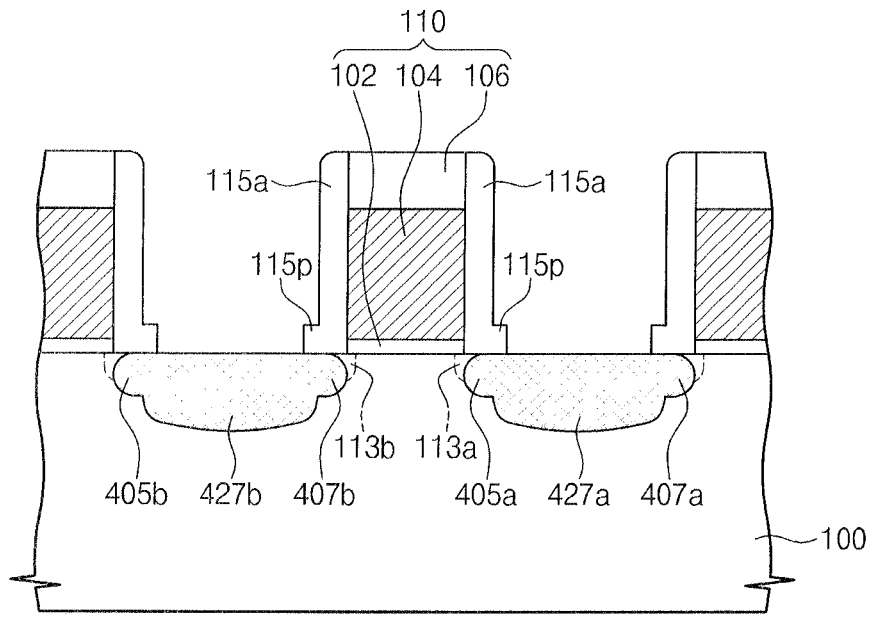
Figure 11C:
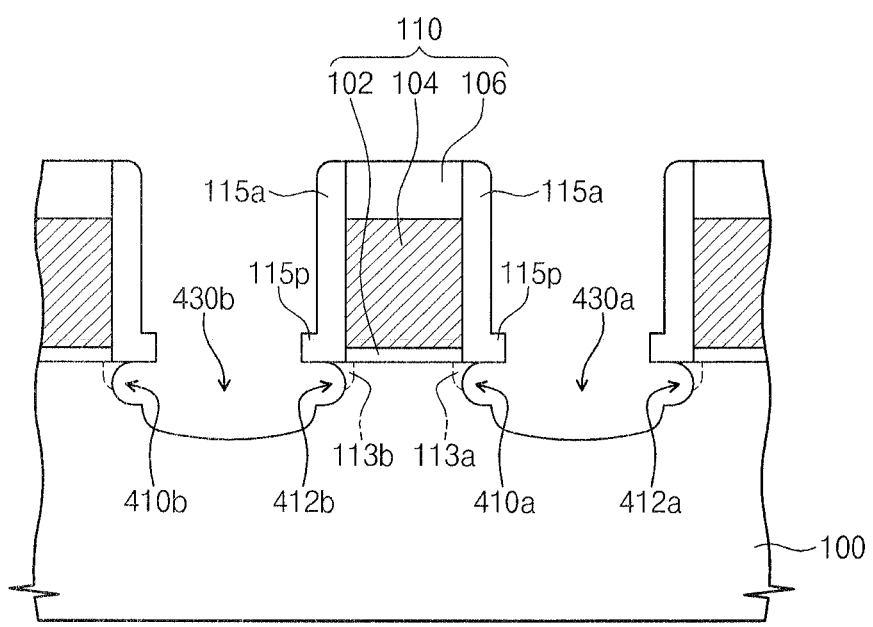
Figure 11D:
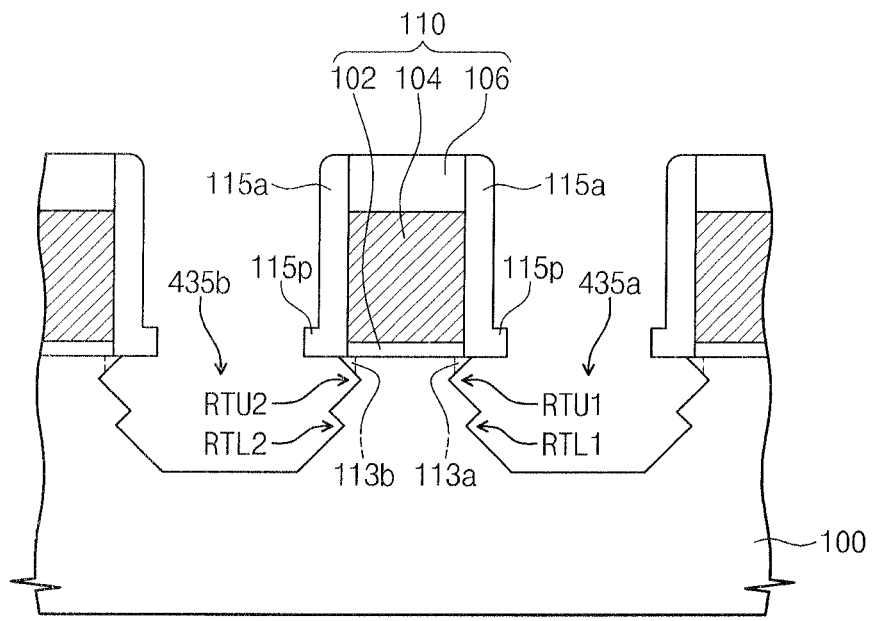
Figure 11E:
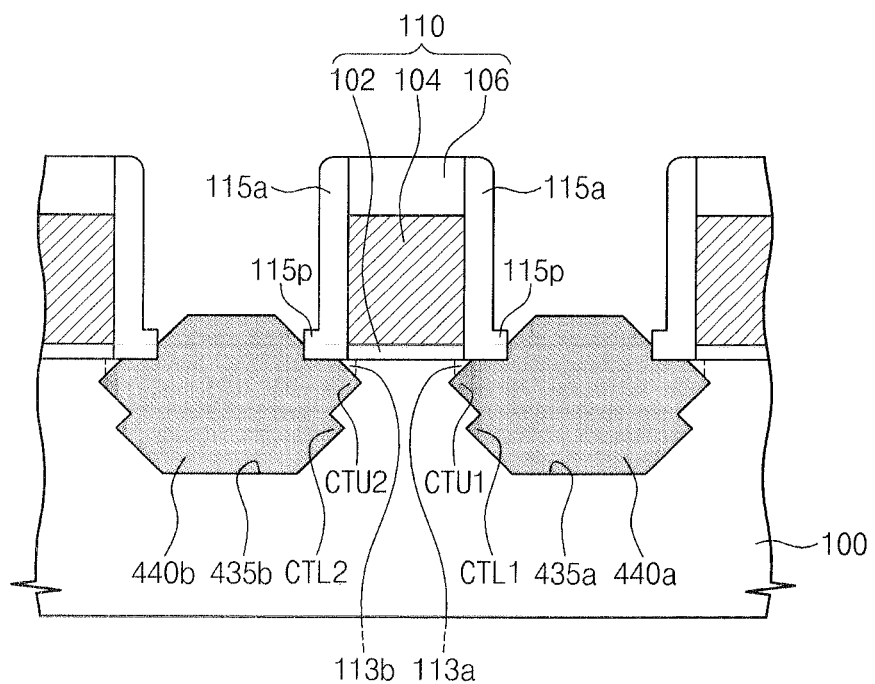
Figure 12A:
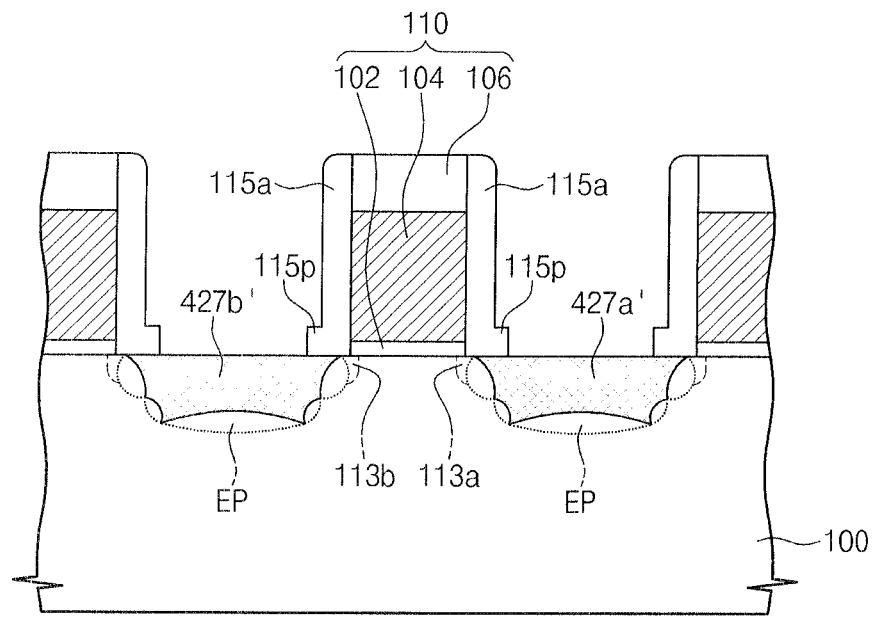
FIGS. 12A and 12B are cross-sectional views illustrating a method of manufacturing a semiconductor device according to an exemplary embodiment of the inventive concept.
Figure 12B:
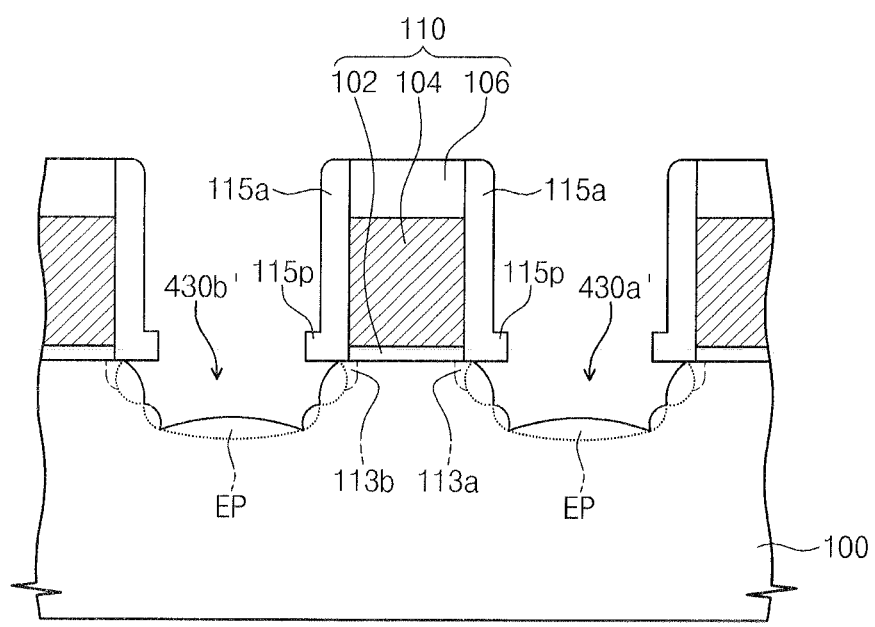

FIGS. 11A through 11E are cross-sectional views illustrating a method of manufacturing a semiconductor device according to an exemplary embodiment of the inventive concept, and FIGS. 12A and 12B are cross-sectional views illustrating a method of manufacturing a semiconductor device according to an exemplary embodiment of the inventive concept. The gate pattern 110 of the present embodiment may be fabricated using the processes described with reference to FIGS. 1A and 1B.

Referring to FIG. 11A, first amorphization element ions 420a may be implanted by a vertical implantation method using the gate pattern 110 and the gate spacers 115a as masks. Second amorphization element ions 420b may be implanted by a first tilt implantation method using the gate pattern 110 and the gate spacers 115a as masks. Third amorphization element ions 420c may be implanted by a second tilt implantation method using the gate pattern 110 and the gate spacers 115a as masks. Since the first, second, and third amorphization element ions 420a, 420b, and 420c are implanted into the semiconductor substrate 100, a first amorphous region 425a and a second amorphous region 425b may be formed in the semiconductor substrate 100 at both sides of the gate pattern 110, respectively.

An implantation direction of the first amorphization element ions 420a may be substantially the same as that of the amorphization element ions 120 described with reference to FIGS. 1C and 2. An implantation direction of the second amorphization element ions 420b may be substantially the same as that of the amorphization element ions 220 described with reference to FIG. 7A. An implantation direction of the third amorphization element ions 420c may be different from the implantation direction of the second amorphization element ions 420b. In some embodiments, the implantation direction of the third amorphization element ions 420c may have an angle substantially symmetric to the implantation direction of the second amorphization element ions 420b with respect to a vertical line perpendicular to the top surface of the semiconductor substrate 100. For example, the implantation direction of the second amorphization element ions 420b may have a first tilt angle in a clockwise direction from the vertical line perpendicular to the top surface of the semiconductor substrate 100, and the implantation direction of the third amorphization element ions 420c may have a second tilt angle in an counterclockwise direction from the vertical line. A size of the first tilt angle may be substantially the same as that of the second tilt angle.

The implantation energy of the first amorphization element ions 420a may be greater than those of the second and third amorphization element ions 420b and 420c. The implantation energy of the second amorphization element ions 420b may be substantially the same as that of the third amorphization element ions 420c.

The first amorphous region 425a may include a first sidewall and a second sidewall which are opposite to each other, and the second amorphous region 425b may include a first sidewall and a second sidewall which are opposite to each other. The first sidewalls of the first and second amorphous regions 425a and 425b may be adjacent to the channel region between the first and second amorphous regions 425a and 425b. Due to the second amorphization element ions 420b, an upper portion of the first sidewall of the first amorphous region 425a may laterally protrude toward the channel region more than a lower portion of the first sidewall of the first amorphous region 425a. Thus, the first amorphous region 425a may include a first tilt implantation region 400a laterally protruding toward the channel region. Due to the third amorphization element ions 420c, an upper portion of the first sidewall of the second amorphous region 425b may laterally protrude toward the channel region more than a lower portion of the first sidewall of the second amorphous region 425b. Thus, the second amorphous region 425b may include a second tilt implantation region 402b laterally protruding toward the channel region.

In some embodiments, an additional tilt implantation region 402a may be formed at an upper portion of the second sidewall of first amorphous region 425a by the third amorphization element ions 420c. An additional tilt implantation region 400b may be formed at an upper portion of the second sidewall of second amorphous region 425b by the second amorphization element ions 420b. In other embodiments, if the second sidewalls of the first and second amorphous regions 425a and 425b are in contact with a device isolation pattern (not shown), the additional tilt implantation regions 402a and 400b may be omitted.

A first amorphization element of the first amorphization element ions 420a may include at least one of the amorphization elements used as the amorphization element ions 120 described with reference to FIGS. 1C and 2. A second amorphization element of the second amorphization element ions 420b may include at least one of the amorphization elements used as the amorphization element ions 120 described with reference to FIGS. 1C and 2. A third amorphization element of the third amorphization element ions 420c may include at least one of the amorphization elements used as the amorphization element ions 120 described with reference to FIGS. 1C and 2. The first, second and third amorphization elements may be the same as each other. Alternatively, the first, second and third amorphization elements may be different from each other. Each dose of the first, second and third amorphization element ions 420a, 420b and 420c may be substantially the same as the dose of the amorphization element ions 120 described with reference to FIGS. 1C and 2. The first, second and third amorphization element ions 420a, 420b and 420c may be implanted at room temperature. Alternatively, the first, second and third amorphization element ions 420a, 420b and 420c may be implanted at the lower process temperature within the range of about −20 degrees Celsius to about −100 degrees Celsius.

Referring to FIG. 11B, an annealing process may be performed on the semiconductor substrate 100 including the first and second amorphous regions 425a and 425b to form first and second phase change regions 427a and 427b. The annealing process may be performed in the same way as the annealing process described with reference to FIGS. 1D and 2. In some embodiments, the annealing process may be performed at the process temperature within the range of about 350 degrees Celsius to about 450 degrees Celsius. Thus, the first and second amorphous regions 425a and 425b may be fully changed to the first and second phase change regions 427a and 427b as illustrated in FIG. 11B.

Due to the first and second tilt implantation regions 400a and 402b, the first and second phase change regions 427a and 427b may include first and second protruding portions 405a and 407b laterally protruding toward the channel region between the first and second phase change regions 427a and 427b, respectively. In some embodiments, due to the additional tilt implantation regions 402a and 400b, the first and second phase change regions 427a and 427b may further include additional protruding portions 407a and 405b, respectively. In other embodiments, the additional protruding portions 407a and 405b may be omitted.

Referring to FIG. 11C, the first and second phase change regions 427a and 427b may be removed to form first and second concave regions 430a and 430b. The first and second phase change regions 427a and 427b may be removed by the wet etching process described with reference to FIGS. 1E and 2. Since the first and second protruding portions 405a and 407b are removed, the first concave region 430a may include a first undercut region 410a protruding toward the channel region, and the second concave region 430b may include a second undercut region 412b protruding toward the channel region. In some embodiments, if the additional protruding portions 407a and 405b are removed, the first and second concave regions 430a and 430b may include additional undercut regions 412a and 410b, respectively.

Referring to FIG. 11D, the anisotropic wet etching process described with reference to FIG. 1F may be performed on the first and second concave regions 430a and 430b. As a result, first and second recess regions 435a and 435b may be formed. Due to the first undercut region 410a, the first recess region 435a may include a first upper tapered undercut region RTU1 and a first lower tapered undercut region RTL1 which are laterally tapered toward the channel region. Due to the second undercut region 412b, the second recess region 435b may include a second upper tapered undercut region RTU2 and a second lower tapered undercut region RTL2 which are laterally tapered toward the channel region.

Further, the annealing process described with reference to FIG. 11B may be performed at the process temperature which is greater than about 450 degrees Celsius and is equal to or less than about 650 degrees Celsius. In this case, as illustrated in FIG. 12A, portions of the first and second amorphous regions 425a and 425b adjacent to the semiconductor substrate 100 may be changed to solid phase epitaxy portions EP, and first and second phase change regions 427a' and 427b' may be formed on the solid phase epitaxy portions EP. The wet etching process described with reference to FIGS. 1E and 2 may be performed to remove the first and second phase change regions 427a' and 427b'. Thus, first and second concave regions 430a' and 430b' illustrated in FIG. 12B may be formed. Subsequently, the anisotropic wet etching process described with reference to FIG. 1F may be performed to form the first and second recess regions 435a and 435b illustrated in FIG. 11D.

Referring to FIG. 11E, an epitaxial process may be performed to form first and second epitaxial patterns 440a and 440b filling the first and second recess regions 435a and 435b, respectively. The first and second epitaxial patterns 440a and 440b may be formed of the same material as the first and second epitaxial patterns 140a and 140b described with reference to FIG. 1G. The first and second epitaxial patterns 440a and 440b may be doped by the same methods used for doping the epitaxial patterns 140a and 140b described with reference to FIG. 1G.

The first epitaxial pattern 440a may include a first upper tapered portion CTU1 and a first lower tapered portion CTL1 which are laterally tapered toward the channel region, and the second epitaxial pattern 440b may include a second upper tapered portion CTU2 and a second lower tapered portion CTL2 which are laterally tapered toward the channel region.

Subsequently, the interlayer dielectric layer 145 and the contact plugs 147a and 147b of FIG. 13 may be formed. The technique described with reference to FIGS. 4A through 4D may be applied to the present embodiment.

Figure 13:
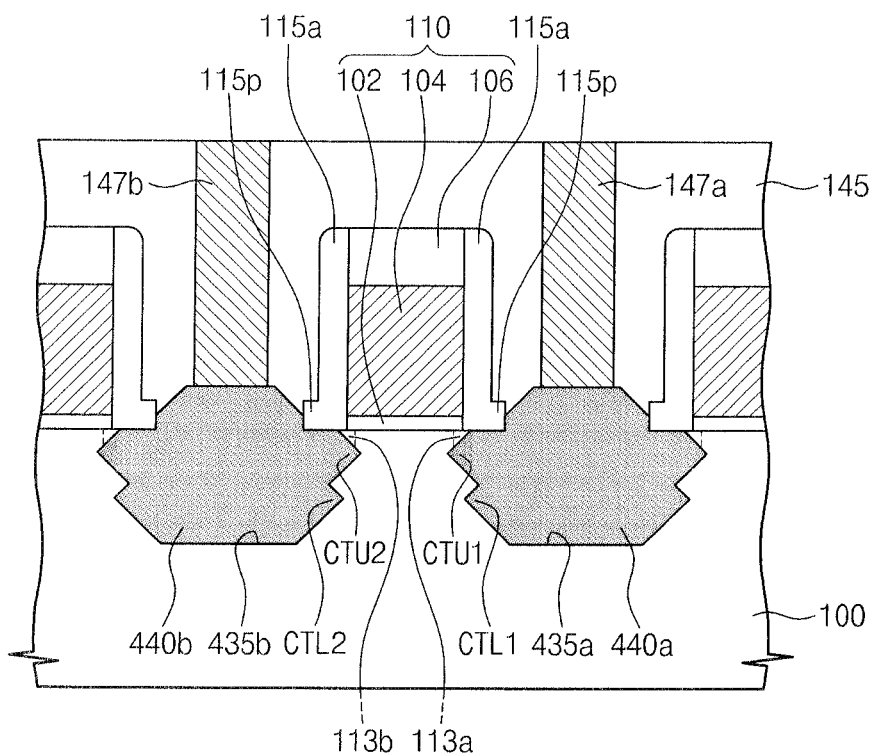
FIG. 13 is a cross-sectional view illustrating a semiconductor device according to an exemplary embodiment of the inventive concept.

FIG. 13 is a cross-sectional view illustrating a semiconductor device according to an exemplary embodiment of the inventive concept. The semiconductor device of FIG. 13 may be fabricated according to the methods of FIGS. 11A through 11E.

Referring to FIG. 13, the first epitaxial pattern 440a and the second epitaxial pattern 440b may fill the first recess region 435a and the second recess region 435b formed in the semiconductor substrate 100, respectively. The first and second recess regions 435a and 435b may be laterally spaced apart from each other. The gate pattern 110 may be disposed on the channel region between the first and second epitaxial patterns 440a and 440b. The first epitaxial pattern 440a may include the first upper and lower tapered portions CTU1 and CTL1 tapered toward the channel region, and the second epitaxial pattern 440b may include the second upper and lower tapered portions CTU2 and CTL2 tapered toward the channel region. The first upper and lower tapered portions CTU1 and CTL1 may be substantially symmetric to the second upper and lower tapered portions CTU2 and CTL2, respectively, about the channel region.

FIGS. 14A through 14E are cross-sectional views illustrating a method of manufacturing a semiconductor device according to an exemplary embodiment of the inventive concept.

Figure 14A:
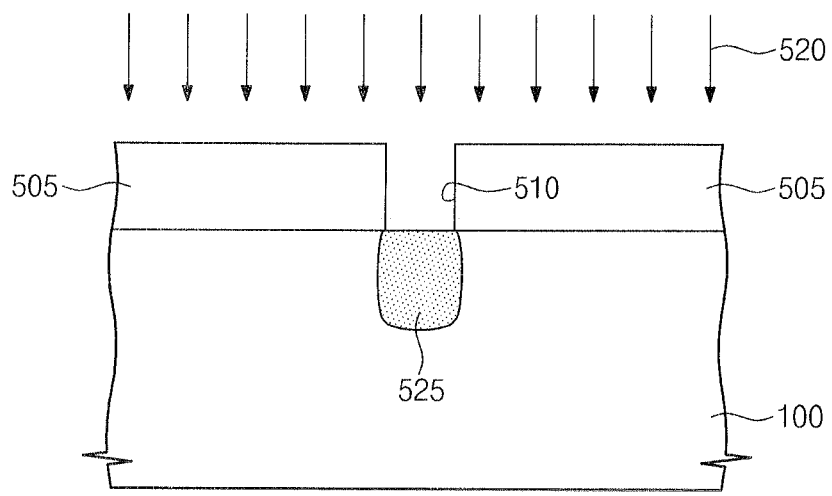
FIGS. 14A through 14E are cross-sectional views illustrating a method of manufacturing a semiconductor device according to an exemplary embodiment of the inventive concept.

Referring to FIG. 14A, a mask pattern 505 having an opening 510 may be formed on the semiconductor substrate 100. Amorphization element ions 520 may be implanted through the opening 510 to form an amorphous region 525 in the semiconductor substrate 100. The amorphization element of the amorphization element ions 520 may include at least one of the amorphization elements used as the amorphization element ions 120 described with reference to FIGS. 1C and 2. An implantation energy, a dose, an implantation direction and a process temperature of the amorphization element ions 520 may be substantially the same as the implantation energy, the dose, the implantation direction and the process temperature of the amorphization element ions 120 described with reference to FIGS. 1C and 2, respectively.

Figure 14B:
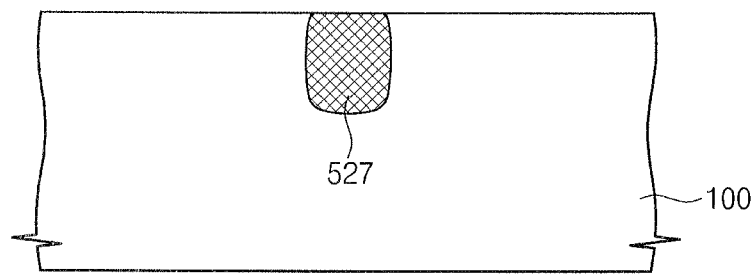

Referring to FIG. 14B, the mask pattern 505 may be removed, and the annealing process described with reference to FIGS. 1D, 2 and 3A may be performed on the semiconductor substrate 100. Thus, a phase change region 527 may be formed.

Figure 14C:
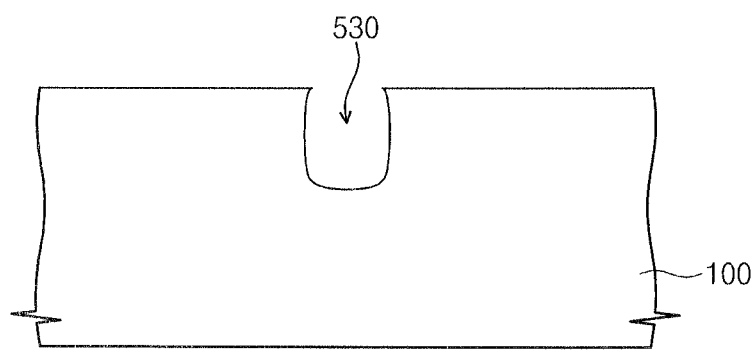

Referring to FIG. 14C, the phase change region 527 may be removed to form a concave region 530. The phase change region 527 may be removed by the wet etching process described with reference to FIGS. 1E and 2.

Figure 14D:
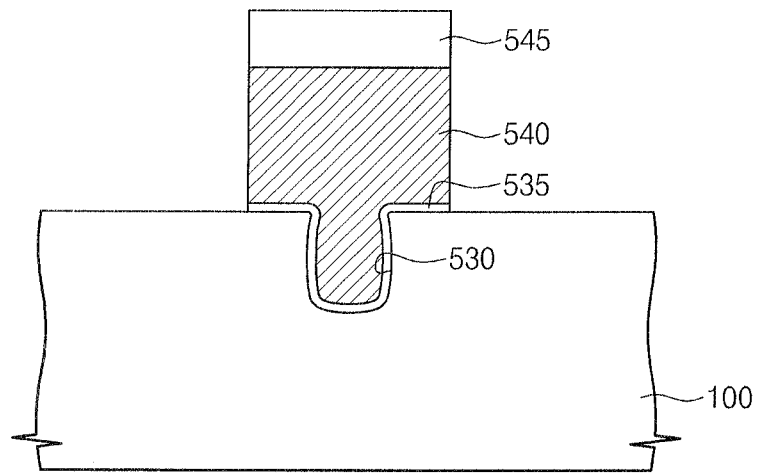

Referring to FIG. 14D, a gate dielectric layer may be conformally formed on the semiconductor substrate 100 having the concave region 530, and a gate conductive layer may be formed on the gate dielectric layer to fill the concave region 530. A hard mask layer may be formed on the gate conductive layer. The hard mask layer, the gate conductive layer, and the gate dielectric layer may be successively patterned to form a gate dielectric pattern 535, a gate electrode 540, and a hard mask pattern 545 that are sequentially stacked. The gate electrode 540 may fill the concave region 530.

Figure 14E:
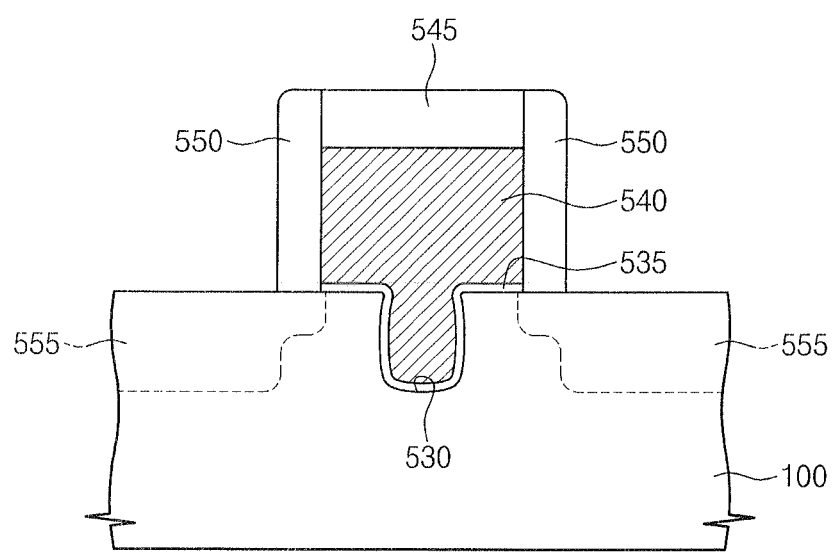

Referring to FIG. 14E, source/drain regions 555 may be formed in the semiconductor substrate 100 at both sides of the gate electrode 540, respectively. Gate spacers 550 may be formed on both sidewalls of the gate electrode 540, respectively.

According to the present embodiment, a recessed channel region of a transistor may be formed using the method of forming the concave region described in the flowchart of FIG. 2.

FIGS. 15A through 15D are cross-sectional views illustrating a method of manufacturing a semiconductor device according to an exemplary embodiment of the inventive concept.

Figure 15A:
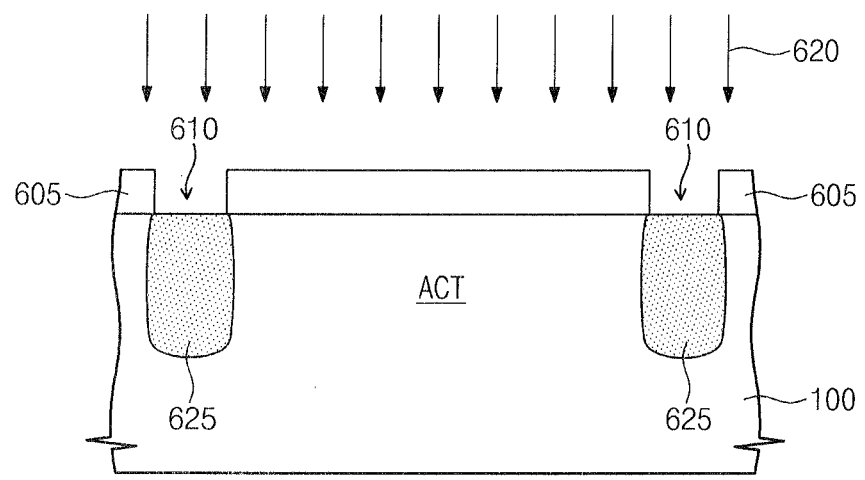
FIGS. 15A through 15D are cross-sectional views illustrating a method of manufacturing a semiconductor device according to an exemplary embodiment of the inventive concept.

Referring to FIG. 15A, a mask pattern 605 having an opening 610 may be formed on the semiconductor substrate 100. The mask pattern 605 may include an oxide and/or a nitride. Amorphization element ions 620 may be implanted through the opening 610 to form an amorphous region 625 defining an active portion ACT in the semiconductor substrate 100. The amorphization element of the amorphization element ions 620 may include at least one of the amorphization elements used as the amorphization element ions 120 described with reference to FIGS. 1C and 2. A dose, an implantation direction and a process temperature of the amorphization element ions 620 may be the same as the dose, the implantation direction and the process temperature of the amorphization element ions 120 described with reference to FIGS. 1C and 2, respectively. In some embodiments, an implantation energy of the amorphization element ions 620 may be within the range of about 10 KeV to about 1 MeV. However, the inventive concept is not limited thereto.

Figure 15B:
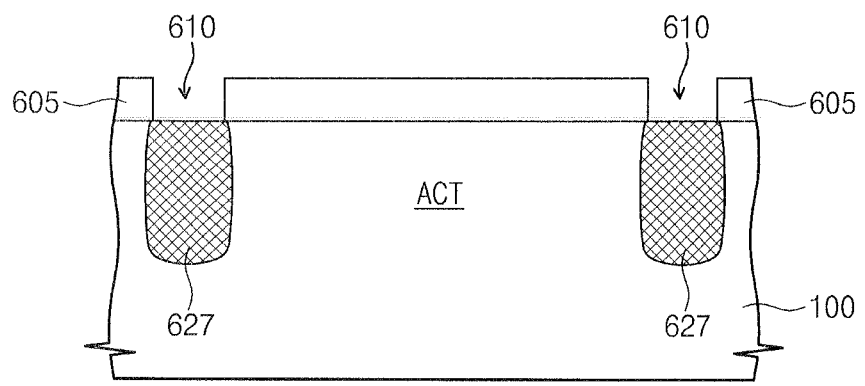

Referring to FIG. 15B, the annealing process described with reference to FIGS. 1D, 2 and 3A may be performed on the semiconductor substrate 100 including the amorphous region 625, thereby forming a phase change region 627.

Figure 15C:
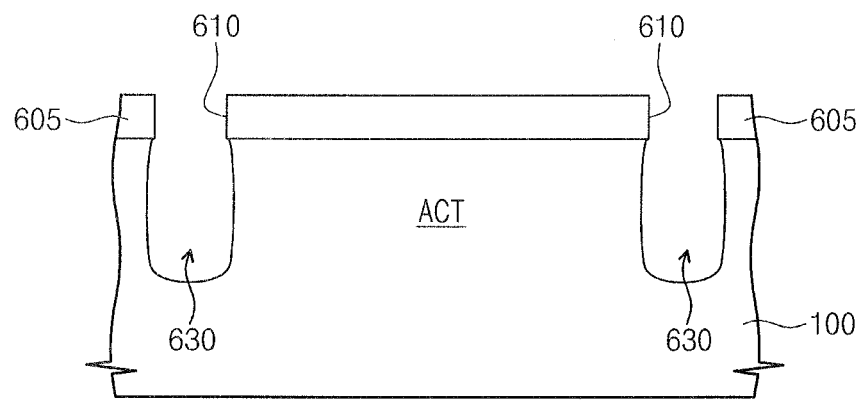

Referring to FIG. 15C, the phase change region 627 may be removed to form a concave region 630. The phase change region 627 may be removed by the wet etching process described with reference to FIGS. 1E and 2.

Figure 15D:
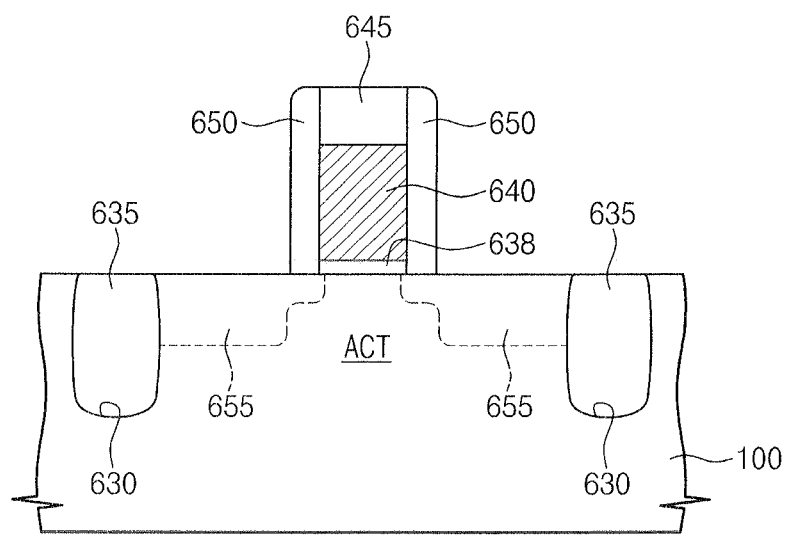

Referring to FIG. 15D, a device isolation layer may be formed on the semiconductor substrate 100 to fill the concave region 630. The device isolation layer may be planarized until the mask pattern 605 is exposed, so that a device isolation pattern 635 filling the concave region 630 may be formed. The device isolation pattern 635 may define the active portion ACT. After the device isolation pattern 635 is formed, the mask pattern 605 may be removed.

Subsequently, a gate dielectric pattern 638, a gate electrode 640, and a hard mask pattern 645 that are sequentially stacked on the active portion ACT may be formed. Source/drain regions 655 may be formed in the active portion ACT at both sides of the gate electrode 640, respectively. Gate spacers 650 may be formed on both sidewalls of the gate electrode 640, respectively.

According to the present embodiment, the device isolation pattern 635 defining the active portion ACT may be formed using the method of forming the concave region described in the flowchart of FIG. 2.

The semiconductor devices according to the above-described embodiments of the inventive concept may be realized as logic devices and/or memory devices. If the semiconductor devices according to the above-described embodiments are realized as memory devices, the transistors of the semiconductor devices may be formed in peripheral circuit regions of the memory devices.

The semiconductor devices according to the above-described embodiments may be encapsulated using various packaging techniques. For example, the semiconductor devices according to the aforementioned embodiments may be encapsulated using any one of a package on package (POP) technique, a ball grid array (BGA) technique, a chip scale package (CSP) technique, a plastic leaded chip carrier (PLCC) technique, a plastic dual in-line package (PDIP) technique, a die in waffle pack technique, a die in wafer form technique, a chip-on-board (COB) technique, a ceramic dual in-line package (CERDIP) technique, a plastic metric quad flat package (PMQFP) technique, a plastic quad flat package (PQFP) technique, a small-outline integrated circuit (SOIC) package technique, a shrink small-outline package (SSOP) technique, a thin small-outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor device according to one of the above-described embodiments is disposed may further include a semiconductor device (e.g., a controller and/or a logic device) that controls the semiconductor device according to the one of the above-described embodiments.

Figure 16:
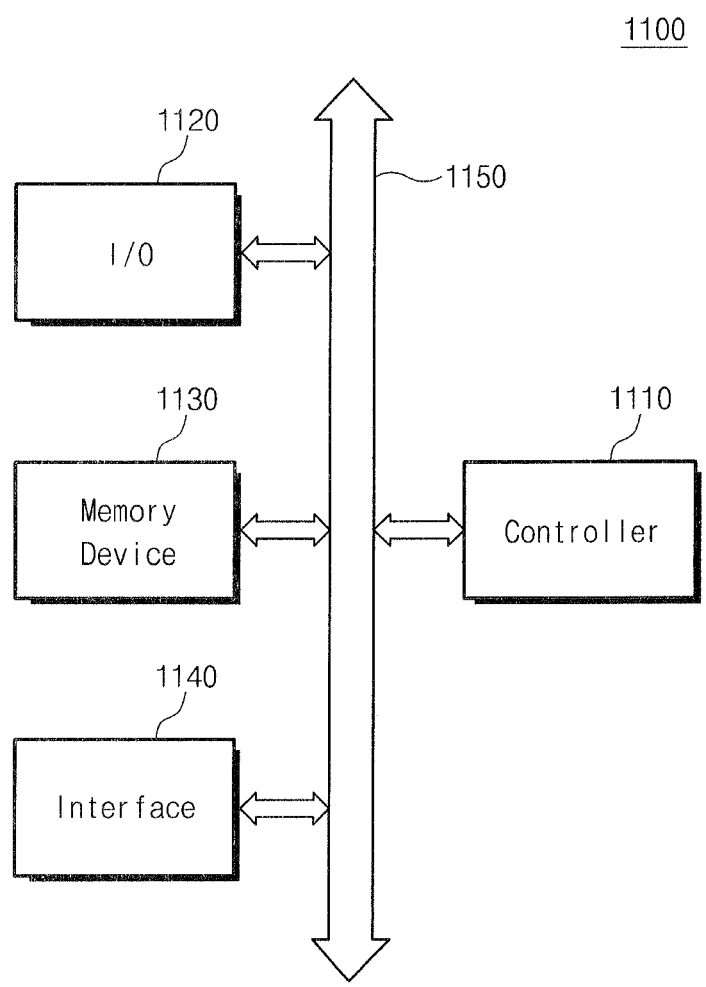
FIG. 16 is a block diagram illustrating an electronic system that may include semiconductor devices according to exemplary embodiments of the inventive concept.

FIG. 16 is a block diagram illustrating an electronic system that may include semiconductor devices according to exemplary embodiments of the inventive concept.

Referring to FIG. 16, an electronic system 1100 according to an exemplary embodiment of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. When the semiconductor devices according to the above-described embodiments are realized as logic devices, the controller 1110 may include at least one of the semiconductor devices according to the above-described embodiments. The I/O unit 1120 may include a keypad, a keyboard and/or a display unit. The memory device 1130 may store data and/or commands. When the semiconductor devices according to the above-described embodiments are realized as memory devices, the memory device 1130 may include at least one of the semiconductor devices according to above-described embodiments. Additionally, the memory device 1130 may further include another type of semiconductor memory device which is different from the semiconductor devices according to the above-described embodiments. For example, the memory device 1130 may further include a non-volatile memory device (e.g., a magnetic memory device, a phase change memory device, etc.), a dynamic random access memory (DRAM) device and/or a static random access memory (SRAM) device. The interface unit 1140 may transmit electrical data to a communication network or may receive electrical data from a communication network. The interface unit 1140 may operate wirelessly or by wire. For example, the interface unit 1140 may include an antenna and/or transceiver for wireless communication or a physical port for wire communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data wirelessly or via wire.

Figure 17:
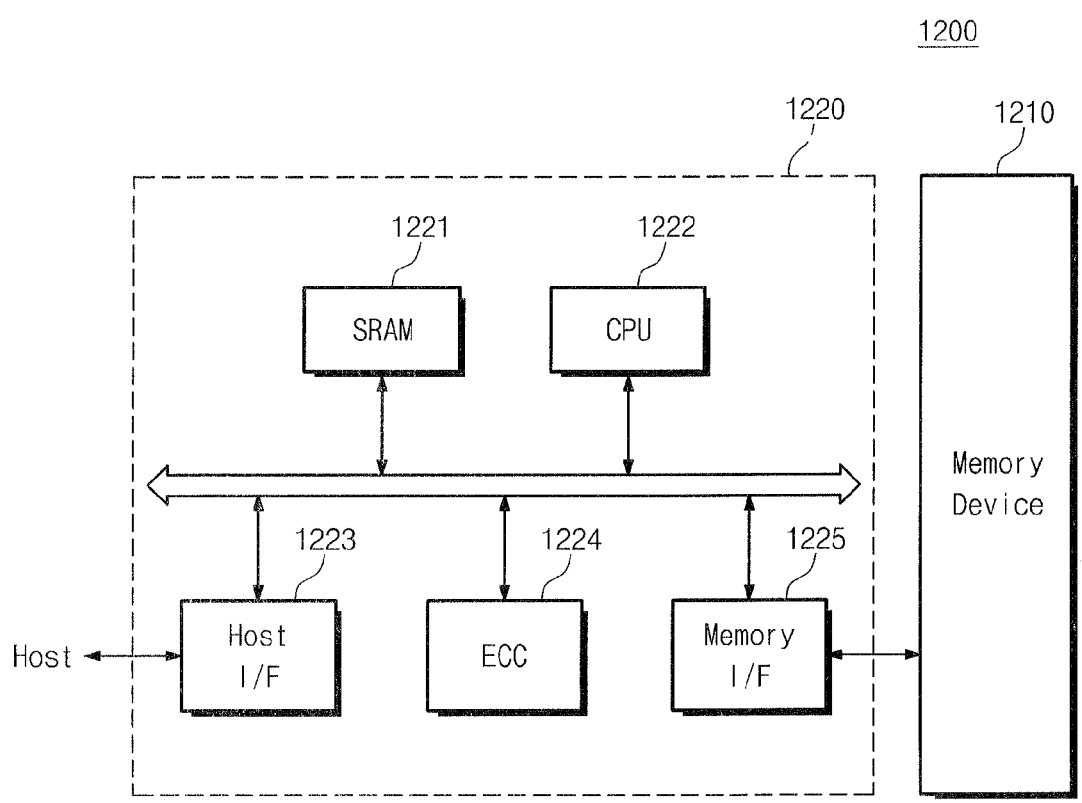
FIG. 17 is a block diagram illustrating a memory card that may include semiconductor devices according to exemplary embodiments of the inventive concept.

FIG. 17 is a block diagram illustrating a memory card that may include semiconductor devices according to exemplary embodiments of the inventive concept.

Referring to FIG. 17, a memory card 1200 according to an exemplary embodiment of the inventive concept may include a memory device 1210. When the semiconductor devices according to the embodiments described above are realized as memory devices, the memory device 1210 may include at least one of the semiconductor devices according to the embodiments described above. In other embodiments, the memory device 1210 may further include other types of semiconductor memory devices which are different from the semiconductor devices according to the embodiments described above. For example, the memory device 1210 may further include a non-volatile memory device (e.g., a magnetic memory device, a phase change memory device, etc.), a DRAM device and/or an SRAM device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 that is used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors in data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may realized as a solid state disk (SSD) which may be used as a hard disk of a computer system.

According to some embodiments of the inventive concept, the amorphization element ions may be implanted to form the amorphous region and the amorphous region may be annealed to form the phase change region. Thus, an etch rate of the phase change region may increase. As a result, the phase change region may be easily removed to form the concave region.

According to other embodiments of the inventive concept, the phase change region formed in the semiconductor substrate may be removed by the wet etching process. Thus, an etch selectivity between the phase change region and the semiconductor substrate may be improved to realize a semiconductor device with improved reliability.

While the inventive concept has been particularly shown and described with reference to exemplary embodiments thereof, it will be understood by those of ordinary skill in the art that various changes in form and detail may be made therein without departing from the spirit and scope of the inventive concept as defined by the following claims.

What is claimed is:

1. A method of manufacturing a transistor of a semiconductor device, comprising:
    forming a gate pattern on a semiconductor substrate;
    forming a spacer on a sidewall of the gate pattern;
    forming a first recess in the semiconductor substrate by wet etching the semiconductor substrate, wherein the first recess is adjacent to the spacer; and
    forming a second recess in the semiconductor substrate by wet etching the first recess, wherein the second recess has tapered sidewalls and at least one tapered sidewall includes a plurality of tapered portions laterally tapered away from the other tapered sidewall.

2. The method of claim 1, wherein the first recess has curved sidewalls.

3. The method of claim 2, wherein at least one tapered sidewall has a {111} crystal plane.

4. The method of claim 1, wherein a portion of the spacer adjacent to a surface of the semiconductor substrate protrudes away from the sidewall of the gate pattern and forms a lower part of the L-shaped spacer.

5. The method of claim 4, further comprising:
    forming an epitaxial pattern that fills the second recess by performing an epitaxial growth process.

6. The method of claim 5, wherein a surface of the epitaxial pattern is disposed over the surface of the semiconductor substrate.

7. The method of claim 5, wherein a doped portion of the epitaxial pattern is a source or a drain of a transistor.

8. The method of claim 7, wherein a channel region of the transistor is formed between adjacent epitaxial patterns.

9. The method of claim 1, wherein the gate pattern includes a gate electrode of a transistor.

10. A method of manufacturing a semiconductor device, comprising:
    forming an amorphous region in a semiconductor substrate by implanting amorphization element ions into the semiconductor substrate;
    forming a phase change region in the semiconductor substrate by annealing the amorphous region;
    forming a first recess in the semiconductor substrate by wet etching the phase change region;
    forming a second recess in the semiconductor substrate by wet etching the first recess, wherein the second recess has tapered sidewalk and at least one tapered sidewall includes a plurality of tapered portions laterally tapered away from the other tapered sidewall; and
    forming an epitaxial pattern that fills the second recess by performing an epitaxial growth process.

11. The method of claim 10, wherein the first recess has curved sidewalls.

12. The method of claim 10, wherein the annealing temperature is less than 500 degrees Celsius.

13. The method of claim 12, wherein the annealing temperature is about 350 degrees Celsius to about 450 degrees Celsius.

14. A method of manufacturing a semiconductor device, comprising:
    forming a first recess in a semiconductor substrate by wet etching the semiconductor substrate, wherein the first recess has curved sidewalls;
    forming a second recess in the semiconductor substrate by wet etching the first recess, wherein the second recess has tapered sidewalk and at least one tapered sidewall includes a plurality of tapered portions laterally tapered away from the other tapered sidewall; and
    forming an epitaxial pattern that fills the second recess by performing an epitaxial growth process, wherein the epitaxial pattern has tapered sidewalls corresponding to the tapered sidewalls of the second recess.

15. The method of claim 14, wherein the first recess has a concave shape.

16. The method of claim 14, wherein before wet etching the semiconductor substrate to form the first recess, the method comprises:
    forming an amorphous region in the semiconductor substrate by implanting amorphization element ions into the semiconductor substrate; and
    forming a phase change region in the semiconductor substrate by annealing the amorphous region,
    wherein the first recess is formed by wet etching the phase change region.

17. The method of claim 16, wherein the annealing is performed at a temperature below 500 degrees Celsius.

18. The method of claim 17, wherein the temperature is about 350 degrees Celsius to about 450 degrees Celsius.

19. The method of claim 16, wherein the amorphization element ions are implanted into the semiconductor substrate by a vertical or tilt implantation method.

20. The method of claim 16, wherein an etchant used to wet etch the semiconductor substrate to form the first recess includes at least one of hydrofluoric acid (HF), nitric acid ($HNO_3$) and acetic acid ($CH_3COOH$).

* * * * *